United States Patent
Jung et al.

(10) Patent No.: US 10,070,522 B2
(45) Date of Patent: Sep. 4, 2018

(54) POPULATION OF METAL OXIDE NANOSHEETS, PREPARATION METHOD THEREOF, AND ELECTRICAL CONDUCTOR AND ELECTRONIC DEVICE INCLUDING THE SAME

(71) Applicant: SAMSUNG ELECTRONICS CO., LTD., Suwon-si, Gyeonggi-do (KR)

(72) Inventors: Doh Won Jung, Seoul (KR); Se Yun Kim, Seoul (KR); Jong Wook Roh, Anyang-si (KR); Jongmin Lee, Hwaseong-si (KR); Sungwoo Hwang, Suwon-si (KR); Jinyoung Hwang, Yongin-si (KR); Chan Kwak, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/342,308

(22) Filed: Nov. 3, 2016

(65) Prior Publication Data

US 2017/0135208 A1    May 11, 2017

(30) Foreign Application Priority Data

Nov. 6, 2015    (KR) .................. 10-2015-0156011

(51) Int. Cl.
*H05K 1/09* (2006.01)
*C01G 55/00* (2006.01)
(Continued)

(52) U.S. Cl.
CPC ............. *H05K 1/09* (2013.01); *C01G 55/004* (2013.01); *C09D 1/00* (2013.01); *C09D 5/24* (2013.01);
(Continued)

(58) Field of Classification Search
CPC .......... H05K 1/09; H05K 1/0274; C09D 1/00; C09D 5/24; B82Y 30/00; B82Y 40/00
(Continued)

(56) References Cited

U.S. PATENT DOCUMENTS

| 2010/0159226 A1 | 6/2010 | Suchanek et al. |
| 2013/0101829 A1* | 4/2013 | Sasaki ............... B05D 3/06 428/323 |

(Continued)

FOREIGN PATENT DOCUMENTS

| JP | 2008-174431 A | 7/2008 |
| JP | 2013-166659 A | 8/2013 |

(Continued)

OTHER PUBLICATIONS

Fukuda et al., "Swelling, intercalation, and exfoliation behavior of layered ruthenate derived from layered potassium ruthenate", Journal of Solid State Chemistry, vol. 182, 2009, pp. 2997-3002.

(Continued)

*Primary Examiner* — Tremesha S Willis
(74) *Attorney, Agent, or Firm* — Cantor Colburn LLP

(57) ABSTRACT

An electrical conductor includes a substrate; and a first conductive layer disposed on the substrate and including a plurality of metal oxide nanosheets, wherein adjacent metal oxide nanosheets of the plurality of metal oxide nanosheets contact to provide an electrically conductive path between the contacting metal oxide nanosheets, wherein the plurality of metal oxide nanosheets include an oxide of Re, V, Os, Ru, Ta, Ir, Nb, W, Ga, Mo, In, Cr, Rh, Mn, Co, Fe, or a combination thereof, and wherein the metal oxide nanosheets of the plurality of metal oxide nanosheets have an average lateral dimension of greater than or equal to about 1.1 micrometers.

18 Claims, 25 Drawing Sheets

(51) Int. Cl.
- *C09D 1/00* (2006.01)
- *C09D 5/24* (2006.01)
- *C09D 7/40* (2018.01)
- *B82Y 30/00* (2011.01)
- *B82Y 40/00* (2011.01)
- *H05K 1/02* (2006.01)
- *C08K 3/22* (2006.01)
- *H05K 3/28* (2006.01)

(52) U.S. Cl.
CPC ............ *C09D 7/70* (2018.01); *B82Y 30/00* (2013.01); *B82Y 40/00* (2013.01); *C01P 2002/72* (2013.01); *C01P 2002/85* (2013.01); *C01P 2004/03* (2013.01); *C01P 2004/04* (2013.01); *C01P 2004/24* (2013.01); *C01P 2004/61* (2013.01); *C01P 2006/40* (2013.01); *C08K 3/22* (2013.01); *H05K 1/0274* (2013.01); *H05K 3/28* (2013.01); *H05K 2201/026* (2013.01); *H05K 2201/032* (2013.01); *H05K 2201/0302* (2013.01); *H05K 2201/0326* (2013.01); *H05K 2201/0338* (2013.01); *H05K 2201/0776* (2013.01); *H05K 2201/10977* (2013.01); *Y10S 977/755* (2013.01); *Y10S 977/896* (2013.01); *Y10S 977/932* (2013.01)

(58) Field of Classification Search
USPC ............... 174/257, 250, 255, 256, 258, 261
See application file for complete search history.

(56) References Cited

U.S. PATENT DOCUMENTS

| 2013/0220405 A1 | 8/2013 | Mahler et al. |
| 2014/0042390 A1* | 2/2014 | Gruner ............ H01M 4/364 257/14 |
| 2014/0093778 A1* | 4/2014 | Askit ............ C30B 29/22 429/231.3 |

FOREIGN PATENT DOCUMENTS

| JP | 2013-253009 A | 12/2013 |
| JP | 2014-136669 A | 7/2014 |
| KR | 1020140017493 A | 2/2014 |

OTHER PUBLICATIONS

Omomo et al., "Redoxable Nanosheet Crystallites of MnO2 Derived via Delamination of a Layered Manganese Oxide", J. Am. Chem. Soc., vol. 125, 2003, pp. 3568-3575.

Sasaki et al., "Macromolecule-like Aspects for a Colloidal Suspension of an Exfoliated Titanate. Pairwise Association of Nanosheets and Dynamic Reassembling Process Initiated from It", J. Am. Chem. Soc., 118, 1996, pp. 8329-8335.

Sasaki et al., "Osmotic Swelling to Exfoliation. Exceptionally High Degrees of Hydration of a Layered Titanate", J. Am. Chem. Soc., 120, 1998, pp. 4682-4689.

Sato et al., "Conductivity of Ruthenate Nanosheets Prepared via Electrostatic Self-Assembly: Characterization of Isolated Single Nanosheet Crystallite to Mono- and Multilayer Electrodes", Langmuir Article, vol. 26(23), 2010, pp. 18049-18054.

Schaak et al., "Perovskites by Design: A Toolbox of Solid-State Reactions", Chem. Mater., vol. 14, 2002, pp. 1455-1471.

Schaak et al., "Prying Apart Ruddlesden-Popper Phases: Exfoliation into Sheets and Nanotubes for Assembly of Perovkite Thin Films", Chem. Mater., vol. 12, 2000, pp. 3427-3434.

Sugimoto et al., "Electrochemical Capacitor Behavior of Layered Ruthenic Acid Hydrate", Journal of the Electrochemical Society, 151 (8), 2004, pp. A1181-A1187.

Tanaka et al., "Oversized Titania Nanosheet Crystallites Derived from Flux-Grown Layered Titanate Single Crystals", Chem. Mater., vol. 15, 2003, pp. 3564-3568.

Wang et al., "Electronics and optoelectronics of two-dimensional transition metal dichalcogenides", Nature Nanotechnology, vol. 7, 2012, pp. 699-712.

Wassei et al., "Graphene, a promising transparent conductor", Materials Today, vol. 13, No. 3, 2010, pp. 52-59.

* cited by examiner

POPULATION OF METAL OXIDE NANOSHEETS, PREPARATION METHOD THEREOF, AND ELECTRICAL CONDUCTOR AND ELECTRONIC DEVICE INCLUDING THE SAME

CROSS REFERENCE TO RELATED APPLICATIONS

This application claims priority to and the benefit of Korean Patent Application No. 10-2015-0156011, filed in the Korean Intellectual Property Office on Nov. 6, 2015, and all the benefits accruing therefrom under 35 U.S.C. § 119, the entire content of which are incorporated herein by reference.

BACKGROUND

1. Field

This disclosure relates to a population of metal oxide nanosheets, a preparation method thereof, and an electrical conductor and an electronic device including the same.

2. Description of the Related Art

An electronic device, such as a flat panel display such as an LCD or LED display, a touch screen panel, a solar cell, a transparent transistor, and the like includes an electrically conductive thin film or a transparent electrically conductive thin film. It is desirable for a material for a transparent electrode to have high light transmittance (e.g., greater than or equal to about 80% in a visible light region) and low specific resistance (e.g., less than or equal to about $1 \times 10^{-4}$ $\Omega$*cm). Currently available oxide materials include indium tin oxide (ITO), tin oxide ($SnO_2$), zinc oxide (ZnO), and the like. ITO is a transparent electrode material and is a transparent semiconductor having a wide bandgap of 3.75 eV, and may be manufactured in a large area using a sputtering process. However, in terms of application to a flexible touch panel, or a UD-grade high resolution display, ITO has poor flexibility and will inevitably cost more due to limited reserves of indium. Therefore, many attempts have been made to replace it.

Recently, a flexible electronic device, e.g., a foldable or bendable electronic device, has been drawing attention as a next generation electronic device. Therefore, there is a need for a material having improved transparency, relatively high electrical conductivity, and suitable flexibility, as well as transparent electrode materials.

SUMMARY

An embodiment provides a flexible electrical conductor having improved electrical conductivity and improved light transmittance.

Another embodiment provides an electronic device including the electrical conductor.

Another embodiment provides a population of metal oxide nanosheets for an electrically conductive layer of the electrical conductor.

Another embodiment provides a method of preparing the population of metal oxide nanosheets.

In an embodiment, an electrical conductor includes a substrate; and a first conductive layer disposed on the substrate and including a plurality of metal oxide nanosheets, wherein adjacent metal oxide nanosheets of the plurality of metal oxide nanosheets contact to provide an electrically conductive path between the contacting metal oxide nanosheets, wherein the plurality of metal oxide nanosheets include an oxide of Re, V, Os, Ru, Ta, Ir, Nb, W, Ga, Mo, In, Cr, Rh, Mn, Co, Fe, or a combination thereof, and wherein the metal oxide nanosheets of the plurality of metal oxide nanosheets have an average lateral dimension of greater than or equal to about 1.1 micrometers.

The plurality of metal oxide nanosheets may include ruthenium oxide, vanadium oxide, manganese oxide, cobalt oxide, iron oxide, rhenium oxide, iridium oxide, indium oxide, or a combination thereof.

The plurality of metal oxide nanosheets may have an average lateral dimension of greater than or equal to about 1.5 µm and an average thickness of less than or equal to about 5 nm.

The first conductive layer may be a discontinuous layer including open spaces between the plurality of metal oxide nanosheets, and an area ratio of open spaces relative to the first conductive layer may be less than or equal to about 50%.

The first conductive layer may have sheet resistance of less than or equal to about 33000 ohm/sq. at light transmittance of about 93% or greater.

The first conductive layer may have sheet resistance of less than or equal to about 15000 ohm/sq. at light transmittance of about 93% or greater.

The metal oxide nanosheet may include $RuO_{2+x}$ (0≤x≤0.5), $MnO_2$, $Mn_3O_7$, $Mn_{1-x}Co_xO_2$ (0<x≤0.4), $VO_2$, $CoO_2$, $FeO_2$, $ReO_2$, $IrO_2$, $InO_2$, or a combination thereof.

The electrical conductor may further include a second conductive layer disposed on the substrate and including an electrically conductive metal nanowire.

The second conductive layer may be disposed between the substrate and the first conductive layer.

The second conductive layer may be disposed on a surface of the first conductive layer.

The conductive metal may include silver (Ag), copper (Cu), gold (Au), aluminum (Al), cobalt (Co), palladium (Pd), or a combination thereof.

The electrically conductive metal nanowire may have an average diameter of less than or equal to about 50 nm and an average length of greater than or equal to about 1 µm.

The electrical conductor may have transmittance of greater than or equal to about 85% at a wavelength of a 550 nm and sheet resistance of less than or equal to about 100 ohm/sq (for example, when the first and/or second conductive layers have a thickness of 100 nm or less, e.g., 90 nm or less, 80 nm or less, 70 nm or less, 60 nm or less, 50 nm or less, 40 nm or less, 30 nm or less, or 20 nm or less,).

The electrical conductor may further include an overcoating layer including a thermosetting resin, an ultraviolet (UV) curable resin, or a combination thereof directly on the first conductive layer.

The electrical conductor may further include an overcoating layer including a thermosetting resin, an ultraviolet (UV) curable resin, or a combination thereof directly on the second conductive layer.

The electrical conductor may have a resistance variation ratio of less than or equal to about 60% after being bent at a curvature radius of about 1 mm.

Another embodiment provides an electronic device including the electrical conductor.

The electronic device may be a flat panel display, a touch screen panel, a solar cell, an e-window, an electrochromic mirror, a heat mirror, a transparent transistor, or a flexible display.

Another embodiment provides a population of nanosheets including a plurality of metal oxide nanosheets, wherein the nanosheets include an oxide of Re, V, Os, Ru, Ta, Ir, Nb, W, Ga, Mo, In, Cr, Rh, Mn, Co, Fe, or a combination thereof, wherein an average lateral dimension of the plurality of metal oxide nanosheets is greater than or equal to about 1.1 micrometers.

The plurality of metal oxide nanosheets may have an average lateral dimension of greater than or equal to about 1.5 μm and an average thickness of less than or equal to about 5 nm.

The plurality of metal oxide nanosheets may include ruthenium oxide, vanadium oxide, manganese oxide, cobalt oxide, iron oxide, rhenium oxide, iridium oxide, indium oxide, or a combination thereof.

The metal oxide nanosheet may include $RuO_{2+x}$ (0≤x≤0.5), $MnO_2$, $Mn_3O_7$, $Mn_{1-x}Co_xO_2$ (0<x≤0.4), $VO_2$, $CoO_2$, $FeO_2$, $ReO_2$, $IrO_2$, $InO_2$, or a combination thereof.

Another embodiment provides a method of preparing the population of the nanosheets, the method including heat-treating a mixture including a transition metal oxide including Re, V, Os, Ru, Ta, Ir, Nb, W, Ga, Mo, In, Cr, Rh, Mn, Co, Fe, or a combination thereof and an alkali metal compound at a temperature of about 750° C. to about 950° C. for about 18 hours or more to obtain a layered alkali metal-transition metal oxide;

pulverizing the layered alkali metal-transition metal oxide to obtain a powder of the layered alkali metal-transition metal oxide;

rinsing the powder of the layered alkali metal-transition metal oxide with water to obtain a powder of a layered alkali metal-transition metal oxide hydrate;

treating the powder of the layered alkali metal-transition metal oxide hydrate with an acidic solution to obtain a layered proton-exchanged transition metal oxide hydrate wherein at least a portion of an alkali metal is exchanged with a proton;

contacting the layered proton-exchanged transition metal oxide hydrate with a $C_1$ to $C_{16}$ alkyl ammonium salt compound to obtain a layered transition metal oxide intercalated with a $C_1$ to $C_{16}$ alkyl ammonium cation; and mixing the layered transition metal oxide intercalated with a $C_1$ to $C_{16}$ alkyl ammonium cation with a solvent to obtain a population of transition metal oxide nanosheets.

The heat-treating may be performed for about 24 hours or longer.

The powder of the layered alkali metal-transition metal oxide hydrate may have an average particle diameter of greater than or equal to about 100 μm.

The electrical conductor of the aforementioned embodiments has an electrically conductive layer including nanosheets with an increased lateral dimension and thus decreased contact resistance between the nanosheets. Therefore, the electrical conductor of the embodiments may have an enhanced conductivity at a high level of light transmittance and improved flexibility.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
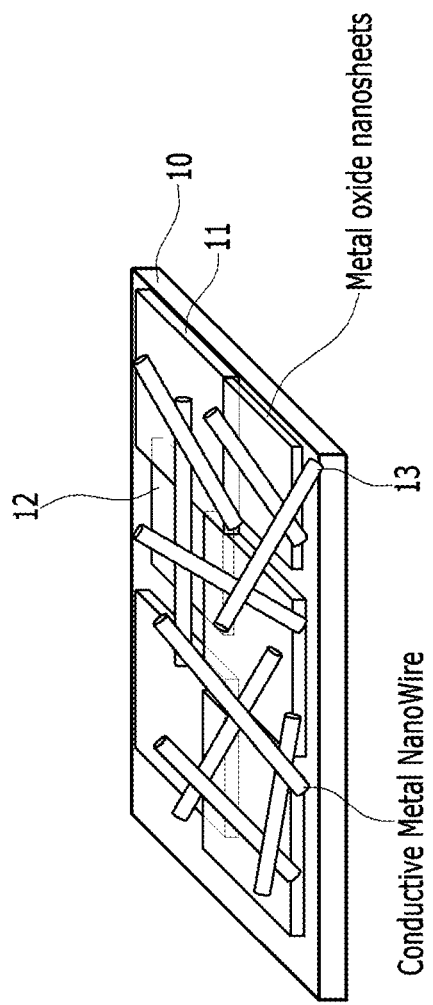
FIG. 1 is a schematic view of an electrical conductor according to one embodiment.

Advantages and characteristics of this disclosure, and a method for achieving the same, will become evident referring to the following exemplary embodiments together with the drawings attached hereto. However, this disclosure may be embodied in many different forms and is not be construed as limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the sheet resistance refers to a value defined by the 4-point probe measurement for the specimen having a predetermined size (e.g., a width of about 8 centimeters (cm) and a length of about 8 cm).

As used herein, the term "nanosheets" refers to a two-dimensional nano material having a thickness in a nano-order size (e.g., thickness of less than or equal to about 100 nanometers (nm)).

"The nanosheets being in contact with one another to provide an electrical connection (e.g., the electrically conduction path)" may refer to the case where the contact between the nanosheets is made to provide an electrical conduction path, and thereby the conductive layer has an electrical conductivity (for example, of a sheet resistance of less than or equal to about 1,000,000 ohm/sq.)

An electrical conductor of an embodiment, e.g., as shown in FIG. 1, includes a substrate 10; and a first conductive layer including a plurality of metal oxide nanosheets 11 disposed on the substrate and the plurality of metal oxide nanosheets include an electrically conductive path 12 provided by contacting metal oxide nanosheets. The plurality of metal oxide nanosheets may include ruthenium oxide, vanadium oxide, manganese oxide, cobalt oxide, or a combination thereof. The plurality of metal oxide nanosheets may have an average lateral size, i.e., an average lateral dimension, of greater than or equal to about 1.1 µm. The terms "providing an electrically conductive path" refers to the case whereby the first conductive layer has an electrical conductivity in a plane direction.

The substrate may be a transparent substrate. The substrate may be flexible. A material for the substrate is not particularly limited, and the substrate may be a glass substrate, a semiconductor substrate, a polymer substrate, or a combination thereof, it may be a substrate in which an insulation layer and/or an electrically conductive film are/is laminated. As non-limiting examples, the substrate may include an inorganic material such as glass; polyester such as polyethylene terephthalate, polybutylene terephthalate, and polyethylene naphthalate; polycarbonate; an acryl-based resin; cellulose or a derivative thereof; a polymer such as polyimide; an organic/inorganic hybrid material; or a combination thereof. The thickness of the substrate is also not particularly limited, but may be appropriately selected considering the type of the final product. The substrate may have a thickness of greater than or equal to about 0.5 µm, for example, greater than or equal to about 1 µm, greater than or equal to about 10 µm, but is not limited thereto. The substrate may have a thickness of less than or equal to about 1 mm, for example, less than or equal to about 500 µm, or less than or equal to about 200 µm, but is not limited thereto. Additional layer (e.g., undercoat) may be provided between the substrate and the electrically conductive layer if desired (e.g., in order to control a refractive index).

A first conductive layer including a plurality of metal oxide nanosheets is disposed on the substrate. The plurality of metal oxide nanosheets include an electrical connection between contacting metal oxide nanosheets. The amount of open space in the first conductive layer is determined by measuring an area of the open space and comparing to a total area of the first conductive layer. For example, a Scanning Electron Microscopic image of the first conductive layer including nanosheets disposed to have an open space is obtained and the area of the open space (i.e., the portion not having the nanosheets in the first conductive layer) is determined and is divided with the total area of the first conductive layer to provide an area ratio. The first conductive layer may be a discontinuous layer including open spaces between the plurality of metal oxide nanosheets, and an area ratio of open spaces relative to a total area of the first conductive layer may be less than or equal to about 50%, for example, less than or equal to about 40%, or less than or equal to about 30%.

The plurality of metal oxide nanosheets includes an oxide of a metal selected from Re, V, Os, Ru, Ta, Ir, Nb, W, Ga, Mo, In, Cr, Rh, Mn, Co, Fe and a combination thereof. The metal oxide may include ruthenium oxide, vanadium oxide, manganese oxide, cobalt oxide, or a combination thereof. In an embodiment, the plurality of metal oxide nanosheets may include ruthenium oxide, vanadium oxide, manganese oxide, cobalt oxide, iron oxide, rhenium oxide, iridium oxide, indium oxide, or a combination thereof. For example, in the plurality of metal oxide nanosheets, the metal oxide may include $RuO_{2+x}$ ($0 \leq x \leq 0.5$, for example, $0 \leq x \leq 0.1$), $MnO_2$, $Mn_3O_7$, $Mn_{1-x}Co_xO_2$ ($0 < x \leq 0.4$), $VO_2$, $CoO_2$, $FeO_2$, $ReO_2$, $IrO_2$, $InO_2$, or a combination thereof.

In the case of the metal oxide, the simulation may provide the electrical conductivity, the light absorption coefficient, and the sheet resistance, and the material may have a high conductivity and a low absorption coefficient to be applied for a transparent electrode material. For example, processing the layered oxide bulk material into nanosheets having a thin thickness (less than or equal to several tens nm) may allow to ensure the high transmittance in a visible light region.

The simulation is based on a first principles calculation. The first principles calculation is a simulation method made by the quantum mechanics and may calculate the optimized atomic structure of material and the electronic structure according to the same. The electronic structure of material is a reference quantity for calculating an electrical conductivity and a light absorption coefficient of the material.

Figure 24:
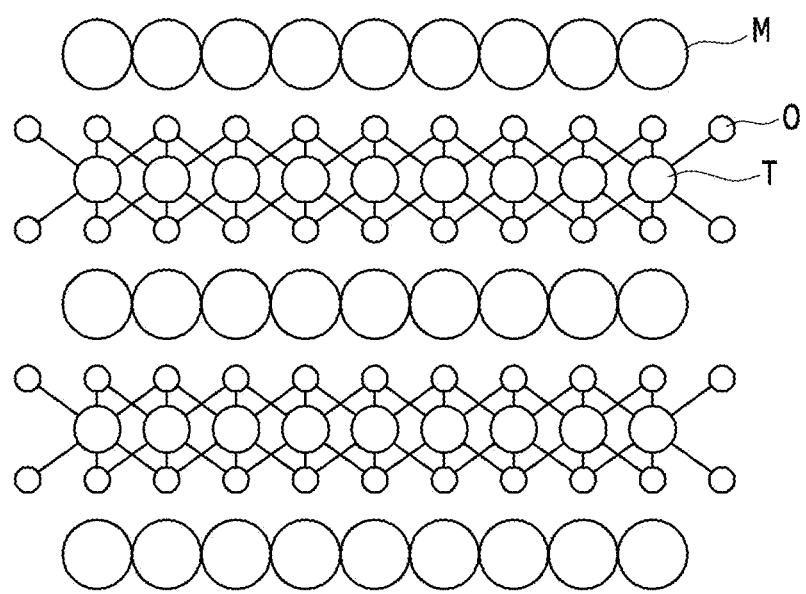
FIG. 24 is a schematic view showing a C12/M1 (12) crystal structure of $AMO_2$ metal (A: alkali metal, M: vanadium or manganese)
Figure 25:
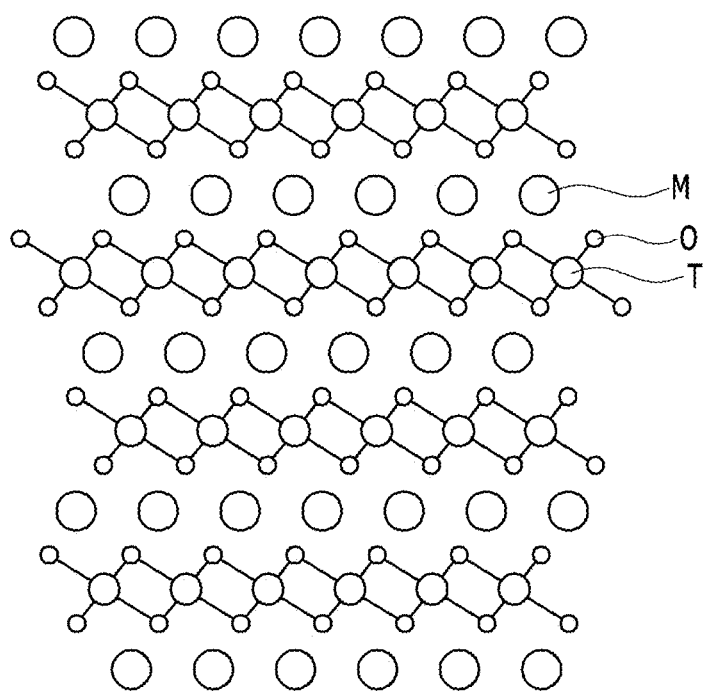
FIG. 25 is a schematic view showing a R3MH (166) crystal structure of $AMO_2$ metal (A: alkali metal, M: ruthenium or cobalt).

First, it may obtain an optimized atomic structure of $MO_2$-type (M=Re, V, Os, Ru, Ta, Ir, Nb, W, Ga, Mo, In, Cr, Rh, Mn, Co, or Fe) including the various transition metals, and the structure, for example, shown in FIG. 24 and FIG. 25 may be considered.

Subsequently, a conductivity and an absorption coefficient of $MO_2$-type metal oxide are calculated according to the following simulation steps, and with reference to the results, the transmittance and the sheet resistance based on 98% may be calculated.

The band-structure of MO2 type material is calculated according to First-principles electronic structure calculations. The intra-band transition by free electron is calculated from the band structure to obtain a conductivity and a plasma frequency.

An inter-band transition due to bound electron is calculated from the band structure.

Dielectric function is calculated considering the effects of free electron and bound electron.

The square-root of dielectric function is obtained to calculate a refractive function in a complex number.

A refractive index to the visible light and the absorption rate for the visible light are calculated from the refractive function.

Table 1 shows the simulation results of calculating a conductivity and an absorption coefficient of the $MO_2$ type (M=metal) material. Considering an absorption coefficient ($\alpha$) and a resistivity ($\rho$) for light having a wavelength of 550 nm at a room temperature, $\alpha \times \rho$ is calculated; and the sheet resistance ($\Omega$/sq) considering a transmittance of 98% is calculated for the corresponding material. In addition, to anticipate the synthesis possibility, the heat of formation (Hf) is also calculated.

TABLE 1

| | Hf (eV/f.u.) | $\sigma\_xy$ (S/cm) ($\tau = 10^{-14}$) | $\alpha\_xy$ (1/cm) | $\alpha\rho\_xy$ ($\Omega/\square$) | $Rs\_xy$ @98% ($\Omega/\square$) |
|---|---|---|---|---|---|
| $Re_1O_2$ | −3.21 | $1.00 \cdot 10^5$ | $4.8 \cdot 10^4$ | 0.5 | 23.8 |
| $V_1O_2$ | −6.49 | $3.07 \cdot 10^4$ | $4.1 \cdot 10^4$ | 1.3 | 66.8 |
| $Os_1O_2$ | −1.62 | $6.70 \cdot 10^4$ | $1.1 \cdot 10^5$ | 1.7 | 83.2 |
| $Ru_1O_2$ | −2.19 | $3.55 \cdot 10^4$ | $6.010^4$ | 1.7 | 83.7 |
| $Ta_1O_2$ | −7.01 | $4.85 \cdot 10^4$ | $8.6 \cdot 10^4$ | 1.8 | 88.2 |
| $Ir_1O_2$ | −1.71 | $3.85 \cdot 10^4$ | $7.8 \cdot 10^4$ | 2.0 | 100.2 |
| $Nb_1O_2$ | −6.89 | $3.82 \cdot 10^4$ | $1.0 \cdot 10^5$ | 2.7 | 134.6 |
| $W_1O_2$ | −4.64 | $5.32 \cdot 10^4$ | $1.8 \cdot 10^5$ | 3.4 | 169.6 |
| $Ga_1O_2$ | −3.08 | $2.11 \cdot 10^4$ | $9.0 \cdot 10^4$ | 4.3 | 210.6 |
| $Mo_1O_2$ | −4.67 | $4.42 \cdot 10^4$ | $1.9 \cdot 10^5$ | 4.3 | 215.2 |
| $In_1O_2$ | −2.42 | $2.24 \cdot 10^4$ | $1.0 \cdot 10^5$ | 4.6 | 227.7 |
| $Cr_1O_2$ | −4.74 | $1.51 \cdot 10^4$ | $8.1 \cdot 10^4$ | 5.4 | 265.6 |
| $Rh_1O_2$ | −1.89 | $3.10 \cdot 10^4$ | $1.7 \cdot 10^5$ | 5.6 | 276.1 |
| $Mn_1O_2$ | −3.93 | $1.95 \cdot 10^4$ | $1.2 \cdot 10^5$ | 6.1 | 299.8 |

With reference to the results of Table 1, the metal oxides may show a relatively low sheet resistance (e.g., 300 ohm/sq) at an improved transmittance.

An average thickness of the metal oxide nanosheet may be less than or equal to about 5 nm, for example, less than or equal to about 3 nm, less than or equal to about 2.5 nm or less than or equal to about 2 nm. The average thickness of the metal oxide nanosheet may be greater than or equal to about 1 nm, for example, greater than 1 nm. When the average thickness is less than or equal to about 3 nm, light transmittance may be improved.

An average lateral size of the plurality of metal oxide nanosheets may be greater than or equal to about 1.1 μm, for example, greater than or equal to about 1.2 μm, greater than or equal to about 1.3 μm, greater than or equal to about 1.4 μm, or greater than or equal to about 1.5 μm. The average lateral size of the plurality of metal oxide nanosheets may be less than or equal to about 30 μm, for example, less than or equal to about 20 μm, less than or equal to about 15 μm, less than or equal to about 14 μm, less than or equal to about 13 μm, less than or equal to about 12 μm, less than or equal to about 11 μm, or less than or equal to about 10.5 μm, but is not limited thereto. The metal oxide nanosheets having the lateral size within the range may provide a conductive layer in the relatively easy way, and the obtained conductive layer may show an improved conductivity at a relatively high light transmittance.

In the conventional art using the intercalation and the exfoliation, the metal oxide nanosheets have an average lateral size in a sub-micron order. When the metal oxide nanosheets having a lateral size of sub-micron (e.g., several hundreds nanometer-order) are connected to each other to provide a conductive path, the number of contact portions required for a unit area is significantly many, causing the high contact resistance. Accordingly, comparing to the sheet resistance which is estimated that single nanosheet may accomplish, the sheet resistance of the conductive layer including these nanosheets may be remarkably enhanced. On the contrary, in the electrical conductor according to an embodiment, as metal oxide nanosheets having a significantly increased size (e.g., average lateral size of greater than or equal to approximate 1.1 μm) form a first conductive layer, the resultant electrical conductor may show a decreased sheet resistance and an improved electrical conductivity at a predetermined light transmittance. In an embodiment, the first conductive layer may have sheet resistance of less than or equal to about 33000 ohm/sq., for example 32000 ohm/sq., less than or equal to about 30000 ohm/sq., less than or equal to about 29000 ohm/sq., less than or equal to about 28000 ohm/sq., less than or equal to about 27000 ohm/sq., less than or equal to about 26000 ohm/sq., less than or equal to about 25000 ohm/sq., less than or equal to about 24000 ohm/sq., less than or equal to about 23000 ohm/sq., less than or equal to about 22000 ohm/sq., less than or equal to about 21000 ohm/sq., less than or equal to about 20000 ohm/sq., less than or equal to about 19000 ohm/sq., less than or equal to about 18000 ohm/sq., less than or equal to about 17000 ohm/sq., less than or equal to about 16000 ohm/sq., less than or equal to about 15000 ohm/sq., less than or equal to about 14000 ohm/sq., less than or equal to about 13000 ohm/sq., less than or equal to about 12500 ohm/sq., less than or equal to about or 12000 ohm/sq. at light transmittance of about 93% or greater.

The metal oxide nanosheets having the thickness and lateral size may be prepared by a method including the steps:
heat-treating a mixture including transition metal oxide including Re, V, Os, Ru, Ta, Ir, Nb, W, Ga, Mo, In, Cr, Rh, Mn, Co, Fe, or a combination thereof and an alkali metal compound at a temperature of about 750° C. to about 950° C. for about 18 or more to obtain a layered alkali metal-transition metal oxide;

pulverizing the layered alkali metal-transition metal oxide to obtain a powder of the layered alkali metal-transition metal oxide;

rinsing the powder of the layered alkali metal-transition metal oxide with water to obtain a powder of a layered alkali metal-transition metal oxide hydrate;

treating a powder of the layered alkali metal-transition metal oxide hydrate with an acidic solution to obtain a layered proton-exchanged transition metal oxide hydrate where at least a portion of an alkali metal is exchanged with a proton;

contacting the layered proton-exchanged transition metal oxide hydrate with a C1 to C16 alkyl ammonium salt compound to obtain a layered transition metal oxide intercalated by alkyl ammonium; and mixing the layered transition metal oxide intercalated by alkyl ammonium with a solvent to obtain a population of transition metal oxide nanosheets.

Examples of the transition metal oxide may be $RuO_2$, $VO_2$, $MnO_2$, $CoO_2$, $FeO_2$, $ReO_2$, $IrO_2$, $InO_2$, $ReO_2$, $OsO_2$, $TaO_2$, $NbO_2$, $WO_2$, $GaO_2$, $MoO_2$, $CrO_2$, $RhO_2$, or a combination thereof, but are not limited thereto, and examples of the alkali metal compound may be alkali metal carbonate (e.g., $Na_2CO_3$, $K_2CO_3$, $Li_2CO_3$, $Cs_2CO_3$ etc.), but are not limited thereto. The mixing ratio of between the transition metal oxide and the alkali metal compound may be appropriately selected considering the composition of metal oxide to be prepared. For example, about 0.1 mol to about 1 mol of alkali metal compound may be mixed per 1 mol of transition metal oxide, but is not limited thereto.

The obtained mixture is heated under the inert atmosphere (e.g., nitrogen atmosphere, argon atmosphere, or vacuum) at a temperature of about 750° C. to about 950° C. (e.g., about 800° C. to about 950° C.) for greater than or equal to about 18 hours, for example, greater than or equal to about 22 hours, greater than or equal to about 23 hours, or greater than or equal to about 24 hours) to provide a layered alkali metal-transition metal oxide. They have a layered structure as shown in FIG. 24, which shows a C12/M1 (12) crystal structure of $AMO_2$ metal, wherein M is an alkali metal, O is oxygen, and T is a transition metal. When is described with an example of alkali metal ruthenium oxide, the alkali metal-ruthenium oxide may have a layered structure of M-$RuO_2$-M-$RuO_2$-M (M=Li, Na, K) (e.g., R3MH (166)). Similarly, the alkali metal-vanadium oxide $MVO_2$ (M=Li, Na, K) may have a layered C12/M1 (12) crystal structure. The alkali metal-manganese oxide $MMnO_2$ (M=Li, Na, K) may have a layered C12/M1 (12) crystal structure (reference: FIG. 24). FIG. 25 shows a R3MH (166) crystal structure of $AMO_2$ metal (A: alkali metal, M: ruthenium or cobalt). The alkali metal-cobalt oxide $MCoO_2$ (M=Li, Na, K) may have a layered R3MH (166) structure (reference: FIG. 25). The alkali metal-transition metal oxide may have a grain size increased under the heat treatment condition.

The obtained layered alkali metal-transition metal oxide is pulverized to provide powder of the layered alkali metal-transition metal oxide, and the obtained powder is rinsed with water to provide powder of layered alkali metal-transition metal oxide hydrate. By the rinsing, the excessive amount of water-soluble components such as alkali metal salt is removed to provide powder including sheet-shaped particles of layered alkali metal-transition metal oxide hydrate.

Under the heat treatment condition, as the sheet-shaped grain size of the layered alkali metal-transition metal oxide is increased, the nanosheets obtained from the later-described exfoliation step may have an increased lateral size. In addition, the heat treatment condition may suppress the forming a secondary phase. Accordingly, an average particle size of the powder of the layered alkali metal-transition metal oxide hydrate may be greater than or equal to about 100 μm, for example, greater than or equal to about 110 μm, greater than or equal to about 120 μm, greater than or equal to about 130 μm, greater than or equal to about 140 μm, greater than or equal to about 150 μm, greater than or equal to about 160 μm, greater than or equal to about 170 μm, greater than or equal to about 180 μm, greater than or equal to about 190 μm, or greater than or equal to about 200 μm. When the powder of the layered alkali metal-transition metal oxide hydrate has the size, the resultant nanosheets (by intercalation and exfoliation) may have a lateral size of greater than or equal to about 1.1 μm.

When the powder of the layered alkali metal-transition metal oxide hydrate is treated with an acidic solution (e.g., agitated in an acidic aqueous solution such as hydrochloric acid, sulfuric acid and the like), a layered proton-exchanged transition metal oxide hydrate that at least a part of alkali metal (e.g., almost or all alkali metal) is exchanged with proton ($H^+$) may be obtained. The acid concentration of acidic aqueous solution, the treatment temperature, the treatment time, and the like may be appropriately selected, and are not particularly limited. The ion exchange process does not substantially change the sheet-shaped morphology of the oxide hydrate and does not cause the size decrease. The forming nanoparticles may be suppressed in the separation/purification process.

The obtained layered proton-exchanged transition metal oxide hydrate contacts a C1 to C16 alkylammonium salt compound (e.g., an aqueous solution of alkylammonium salt compound) (hereinafter, referred to intercalation treatment) to provide a layered transition metal oxide in which alkyl ammonium is intercalated (hereinafter, referred to layered alkylammonium-transition metal oxide). The alkylammonium salt molecule is entered between metal oxide layers to help the exfoliation.

The concentration of an aqueous solution of alkylammonium salt compound may be about 0.01 to about 20 mol % based on proton of the layered proton-exchanged transition metal oxide hydrate, but is not limited thereto. The temperature and time of intercalation treatment are not particularly limited and may be appropriately selected. For example, the intercalation treatment may be performed at a temperature of about 25° C. to about 60° C. (e.g., room temperature) for greater than or equal to about 24 hours, for example, greater than or equal to about 2 days or greater than or equal to about 3 days, but is not limited thereto.

According to an embodiment, the alkyl ammonium salt compound may be a mixture of two or more kinds of compounds having different sizes. When the intercalation treatment is performed by using two or more kinds of alkyl ammonium salt compounds, the two or more kinds of alkyl ammonium salt compounds (hereinafter, also called 'intercalant') may be present on the surface of the obtained metal oxide nanosheets.

When the small-sized intercalant is used together with and the large-sized intercalant, the small intercalant is easily intercalated between layers of layered protonated transition metal oxide hydrate, which may help the large intercalant to uniformly intercalate between layers of metal oxide hydrate. Accordingly, compared to the exfoliation using the single intercalant, the case of using two or more kinds of intercalants may provide nanosheets having an appropriate thickness by a high exfoliation efficiency, and the lateral size of the obtained nanosheets is also increased.

The two kinds of alkylammonium compounds may be selected from tetramethylammonium compound (e.g., tetramethylammonium hydroxide), tetraethylammonium compound (e.g., tetraethylammonium hydroxide), tetrapropylammonium compound (e.g., tetrapropylammonium hydroxide), benzylalkylammonium compound (e.g., benzylmethylammonium hydroxide), and tetrabutylammonium compound (e.g., tetrabutylammonium hydroxide). The two kinds of alkylammonium compounds may include at least one of tetramethylammonium compound and tetraethylammonium compound, and at least one of a tetrapropylammonium compound, a benzylalkylammonium compound and a tetrabutylammonium compound.

When the obtained layered alkylammonium-transition metal oxide is mixed with a solvent, it is exfoliated to provide nanosheets of transition metal oxide. The intercalation treatment and the solvent mixing step may be simultaneously performed. For the exfoliation, ultrasonication may be performed. The solvent may be a high dielectric constant solvent. The solvent may be one or more selected from water, alcohol, acetonitrile, dimethylsulfoxide, dimethyl formamide, and propylenecarbonate.

The metal oxide nanosheets prepared according to the method has the thickness and the lateral size, and the first conductive layer including the same has lowered contact resistance and improved electrical conductivity (i.e., lowered sheet resistance).

The electrical conductor may further include a second conductive layer disposed on the substrate and including an electrically conductive metal nanowire 13. The second conductive layer may be disposed between the substrate and the first conductive layer. Alternately, the first conductive layer may be disposed on the substrate, and the second conductive layer may be disposed on the first conductive layer (refer to FIG. 1). The second conductive layer and the first conductive layer contact each other.

The first conductive layer may include a conductive metal such as silver (Ag), copper (Cu), gold (Au), aluminum (Al), cobalt (Co), palladium (Pd), or a combination thereof (e.g., an alloy thereof, or a nanometal wire having two or more segments). For example, the electrically conductive metal nanowire may be a silver nanowire.

The electrically conductive metal nanowire may have an average diameter of less than or equal to about 50 nm, for example, less than or equal to about 40 nm, less than or equal to about 30 nm. The length of electrically conductive metal nanowire is not particularly limited, but may be appropriately selected according to a diameter. For example, the electrically conductive metal nanowire may have a length of greater than or equal to about 1 μm, greater than or equal to about 2 μm, greater than or equal to about 3 μm, greater than or equal to about 4 μm, greater than or equal to about 5 μm, but is not limited thereto. In another embodiment, the electrically conductive metal nanowire may have a length of greater than or equal to about 10 μm, for example, greater than or equal to about 11 μm, greater than or equal to about 12 μm, greater than or equal to about 13 μm, greater than or equal to about 14 μm, or greater than or equal to about 15 μm. The electrically conductive metal nanowire may be prepared according to known methods, or commercially available. The nanowire may include a polymer coating of polyvinylpyrrolidone on the surface thereof.

The first conductive layer including the metal oxide nanosheets and the second conductive layer including the electrically conductive metal nanowire may be formed by the known method of forming a layer, and is not particularly limited.

According to non-limiting example, a first conductive layer including metal oxide nanosheets may be formed on one surface of substrate; and a second conductive layer including electrically conductive metal nanowires may be formed on one surface of the first conductive layer. Alternatively, a second conductive layer including electrically conductive metal nanowires may be formed on one surface of substrate; and a first conductive layer including metal oxide nanosheets may be formed on the second conductive layer.

The first conductive layer or the second conductive layer may be formed by applying an appropriate coating composition (including nanosheets or nanowires) on a substrate (or the second or first conductive layer) and removing a solvent. The coating composition may include an appropriate solvent (e.g., water, an organic solvent miscibile or non-miscibile with water, etc.) and may further include a dispersing agent (e.g., hydroxypropylmethyl cellulose).

For example, the ink composition including the electrically conductive metal nanowires may be commercially available or may be prepared according to known methods. For example, the ink composition may have the composition shown in Table 2, but is not limited thereto.

TABLE 2

| | Material | Amount |
| --- | --- | --- |
| Electrically conductive metal | Electrically conductive metal (e.g. Ag) nanowire aqueous solution (concentration: 0.001-10.0 wt %) | 5-40 wt % |
| Solvent | Water | 20-70 wt % |
| | Alcohol (ethanol) | 10-40 wt % |
| Dispersing agent | hydroxypropyl methyl cellulose aqueous solution (conc.: 0.05-5 wt %) | 1-10 wt % |

For example, the composition including the metal oxide nanosheets may have the composition shown in Table 3, but is not limited thereto:

TABLE 3

| | Material | Amount |
| --- | --- | --- |
| Electrically conductive material | metal oxide nanosheet (e.g., $RuO_{2+x}$) aqueous solution (concentration: 0.001-10.0 g/L) | 30-70 wt % |
| Solvent | water | 10-50 wt % |
| | isopropanol | 1-20 wt % |
| Dispersing agent | hydroxypropyl methyl cellulose aqueous solution (0.05-5 wt %) | 5-30 wt % |

The concentration of nanosheet aqueous solution may be appropriately adjusted considering a size of nanosheets, a thickness, and the electrical conductivity required for the electrical conductor, the light transmittance required for the electrical conductor, the coating property of an aqueous solution, and the like. For example, the concentration of nanosheet aqueous solution may be greater than or equal to about 0.001 g/L and less than or equal to about 10.00 g/L, but is not limited thereto.

The composition is coated on a substrate (or selectively, preliminarily formed first or second conductive layer) and, selectively, dried and heat-treated to prepare an electrically conductive layer. The composition may be applied according to various methods, for example, bar coating, blade coating, slot die coating, spray coating, spin coating, gravure coating, inkjet printing, or a combination thereof. The nanosheets may contact each other to provide an electrical connection.

The first conductive layer and/or the second conductive layer may include an organic binder for biding the nanowires or nanosheets. The binder desirably controls viscosity of a composition for forming an electrically conductive layer and increases binding the nanowires on a substrate. Non-limiting examples of the binder may include methyl cellulose, ethyl cellulose, hydroxypropyl methyl cellulose (HPMC), hydroxypropyl cellulose (HPC), xanthan gum, polyvinyl alcohol (PVA), polyvinyl pyrrolidone (PVP), carboxylmethyl cellulose, hydroxyethyl cellulose, or a combination thereof. An amount of the binder may be appropriately selected and is not particularly limited thereto. In non-limiting examples, amount of the binder may be about 1 to about 100 parts by weight based on 100 parts by weight of the nano-sized conductors, but is not limited thereto.

The thickness of first conductive layer is not particularly limited, and may be appropriately selected considering the light transmittance and the electrical conductivity required for the electric conductor. For example, the thickness of first conductive layer may be less than or equal to about 20 nm, for example, less than or equal to about 5 nm, but is not limited thereto. The thickness of second conductive layer may be less than or equal to about 200 nm, for example, less than or equal to about 100 nm, but is not limited thereto.

The electrical conductor having the structure may show an enhanced conductivity and an enhanced light transmittance and also show an improved flexibility. The electrical conductor may have light transmittance of about 85% or greater for example about 88% or greater or about 89% or greater at a wavelength of a 550 nm and sheet resistance of less than or equal to about 100 ohm/sq., for example, 90 ohm/sq., less than or equal to about 80 ohm/sq., less than or equal to about 70 ohm/sq., less than or equal to about 60 ohm/sq., less than or equal to about 50 ohm/sq., less than or equal to about 40 ohm/sq., less than or equal to about 39 ohm/sq., less than or equal to about 38 ohm/sq., less than or equal to about 37 ohm/sq., less than or equal to about 36 ohm/sq., less than or equal to about or 35 ohm/sq.

The electrical conductor may further include an overcoating layer (OCL) including a thermosetting resin, an ultraviolet (UV) curable resin, or a combination thereof on the first conductive layer or the second conductive layer. Specific examples of the thermosetting resin and the ultraviolet (UV) curable resin for OCL are known. In an embodiment, the thermosetting resin and the ultraviolet (UV) curable resin for an overcoating layer (OCL) may be urethane(meth)acrylate, perfluoropolymer having a (meth)acrylate group, poly(meth)acrylate having a (meth)acrylate group, epoxy (meth)acrylate, or a combination thereof. The overcoating layer may further include an inorganic oxide particulate (e.g., silica particulate). The method of forming the OCL on the electrically conductive thin film from the above-mentioned materials is also known, and is not particularly limited.

The electrical conductor may have an improved flexibility. For example, the resistance decreasing rate after bending may be significantly lower than the case of using only nanowire. According to an embodiment, the electrical conductor may have a resistance variation ratio of less than or equal to about 60%, for example, less than or equal to about 50%, less than or equal to about 40%, or less than or equal to about 30% after bending 200,000 times at a curvature radius of about 1 mm (1R).

In another embodiment, an electronic device includes the electrical conductor.

The electronic device may be a flat panel display, a touch screen panel, a solar cell, an e-window, an electrochromic mirror, a heat mirror, a transparent transistor, or a flexible display.

Figure 2:
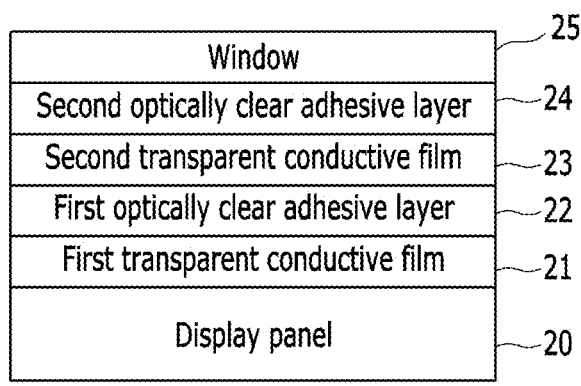
FIG. 2 is a cross-sectional schematic view of an electronic device (touch screen panel) according to one embodiment.

In an exemplary embodiment, the electronic device may be a touch screen panel (TSP). The detailed structure of the touch screen panel is well known. The schematic structure of the touch screen panel is shown in FIG. 2. Referring to FIG. 2, the touch screen panel may include a first transparent conductive film 21, a first transparent adhesive film (e.g., an optically clear adhesive (OCA)) film 22, a second transparent conductive film 23, a second transparent adhesive film 24, and a window for a display device 25, on a panel for a display device (e.g., an LCD panel) 20. The first transparent conductive layer and/or the second transparent conductive layer may be the electrical conductor or hybrid structure.

In addition, an example of applying the electrical conductor to a touch screen panel (e.g., a transparent electrode of TSP) is illustrated, but the conductor may be used as an electrode for other electronic devices including a transparent electrode without a particular limit. For example, the conductor may be applied as a pixel electrode and/or a common electrode for a liquid crystal display (LCD), an anode and/or a cathode for an organic light emitting diode device, or a display electrode for a plasma display device.

Hereinafter, the embodiments are illustrated in more detail with reference to examples. These examples, however, are not in any sense to be interpreted as limiting the scope of this disclosure.

EXAMPLES

Measurement:

[1] Measurement of sheet resistance: Sheet resistance is measured as follows.

Measurer: Mitsubishi Ioresta-GP (MCP-T610), ESP type probes (MCP-TP08P)

Sample size: width 20 cm×length 30 cm

Measurement: average after repeating the measurement at least 9 times

[2] Measurement of light transmittance: Light transmittance is measured as follows.

Measurer: NIPPON DENSHOKU INDUSTRIES (NDH-7000 SP)

Sample size: width 20 cm×length 30 cm

Sample Measurement: average after repeating the measurement at least 9 times

[3] Measurement of haze: Haze is measured as follows.

Measurer: NIPPON DENSHOKU INDUSTRIES (NDH-7000 SP)

Sample size: width 20 cm×length 30 cm

Sample Measurement: average after repeating the measurement at least 9 times

[4] Scanning Electron Microscope (SEM) and Atomic Force Microscope (AFM) Analysis: Scanning electron microscope and atom atomic force microscope analysis are performed using the following devices to measure a lateral size and a thickness of nanosheets, a thickness of conductive layers, and the like.

Electron microscope: FE-SEM (Field Emission Scanning Electron Microscopy) Hitachi (SU-8030)
Atomic force microscope (SPM): Bruker (Icon)
[5] XPS Analysis: (performed for powders)
  Measurer: Manufacturer+Model name
  Manufacturer: Ulvac PHI, Model name: Versaprobe
[6] ICP Analysis: (performed for powders)
  Measurer: Manufacturer+Model name
  Manufacturer: SHIMADZU, Model name: ICPS-8100

Reference Example 1: Two-Dimensional Percolation Calculation

In the conductive layer including metal oxide nanosheets, in order to find the relationship between the lateral size of metal oxide nanosheets and the conductivity of conductive layer, $RuO_{2+x}$ nanosheets are performed with a 2D percolation calculation as follows:

$RuO_{2+x}$ is simplified as a disk having a diameter of average lateral size of nanosheets, and the lateral conductivity ($\sigma_{lateral\ direction}$) of $RuO_{2+x}$ is obtained from First principles calculation. For the convenience of calculation, a contact resistance (Rc) between sheets is approximated through the vertical direction conductivity ($\sigma_{thickness\ direction}$) of $RuO_{2+x}$ nanosheet obtained by First principles calculation.

Figure 3:
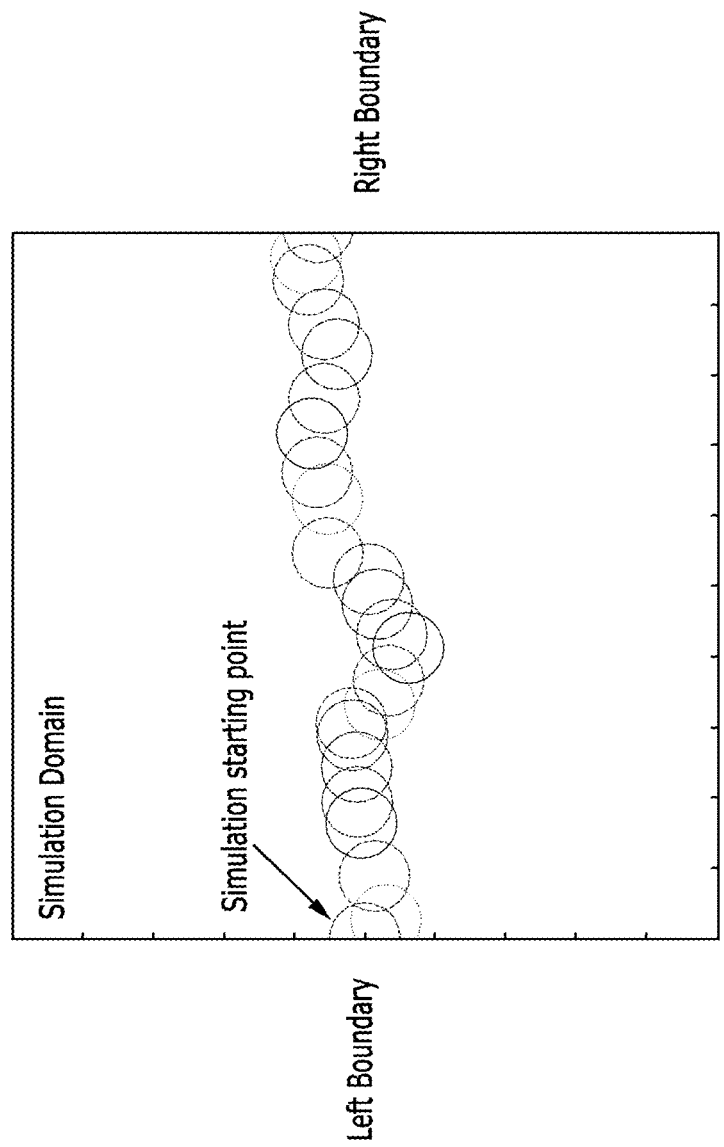
FIG. 3 is a schematic view showing a random work path in a two-dimensional percolation simulation of the nanosheets that is conducted in Example 1.

It obtains the average number (Nc) of adjacent sheets per sheet according to the area density of $RuO_{2+x}$ nanosheets. Subsequently, it random generate disks in the number (Nc) how many disks, which are positioned in the left boundary center of square simulation domain (in FIG. 3, at the simulation starting point), are overlapped. Thereby, it selects a disk which is capable of flowing current in the farthest in a +x direction and with the lowest resistance among the generated disks. It random generates disks in the number (Nc) overlapped with the selected disk. The same process is repeated until the selected disk is approached to the right boundary of the simulation domain. The random walk path of the disk is shown in FIG. 3. The random work path is one of the current paths of conductive layer including nanosheets. It obtains the number of disks providing the path and the total resistance in which current is flowed in this case. From the results, the equivalent circuit of conductive layer is made to calculate the sheet resistance of nanosheet conductive layer. The calculation is repeated for several hundred times to provide an ensemble average, and it estimates the sheet resistance of conductive layer including nanosheet from the ensemble average. The estimate is an ideal value that the secondary resistance generating factors such as defects are removed and does not consider the resistance which may be caused by polymer or the like used for a conductive layer. The results are shown in FIG. 4.

Figure 4:
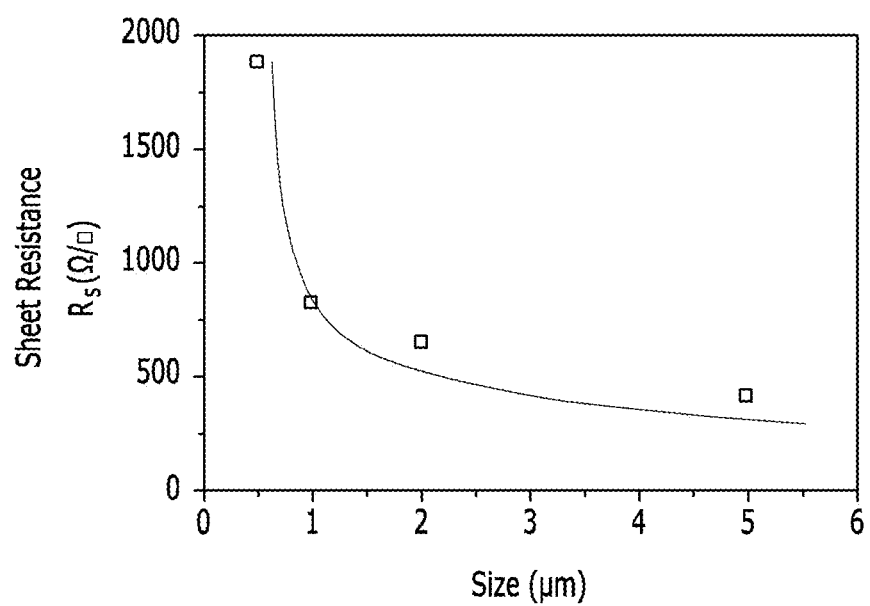
FIG. 4 shows a sheet resistance change with respect to the fixed areal coverage obtained by two-dimensional percolation calculation of nanosheets.

From the results of FIG. 4, it is confirmed that the micron-sized nanosheets may show a significantly low sheet resistance compared to the sub-micron sized nanosheets.

Without being bound by any particular theory, it is believed that the less influences of contact resistance is made as nanosheets have larger lateral size. In addition, when nanosheet areal coverages are same, the number density of sheet is decreased as the lateral size of nanosheets is increased, so the results may suggest that it may be accumulated into a sheet resistance of single sheet.

Preparation of $RuO_{2+x}$ Nanosheets

Example 1

Figure 5:
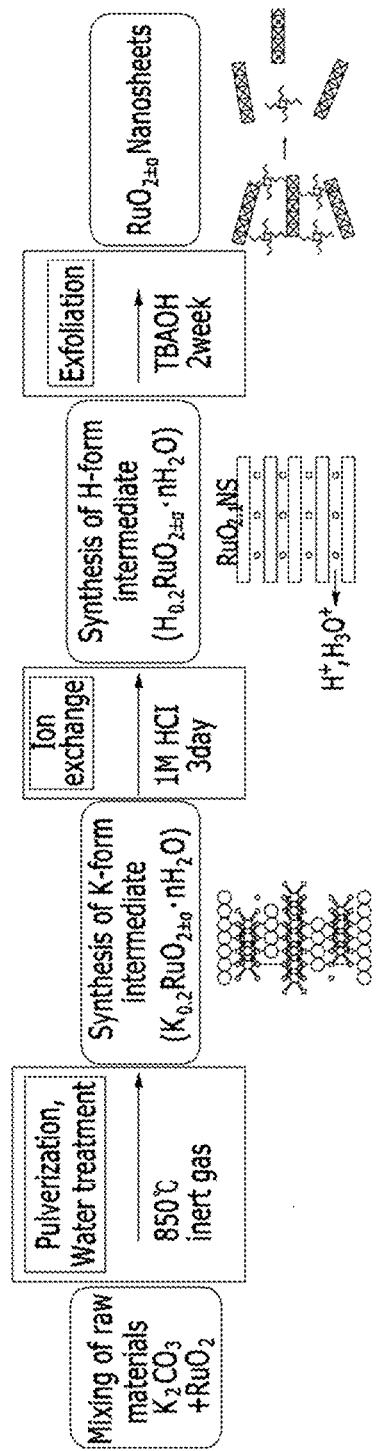
FIG. 5 is a schematic view showing a process of preparing ruthenium oxide nanosheets according to the Examples.

Ruthenium oxide nanosheets are prepared as schematically shown in FIG. 5.

Figure 6:
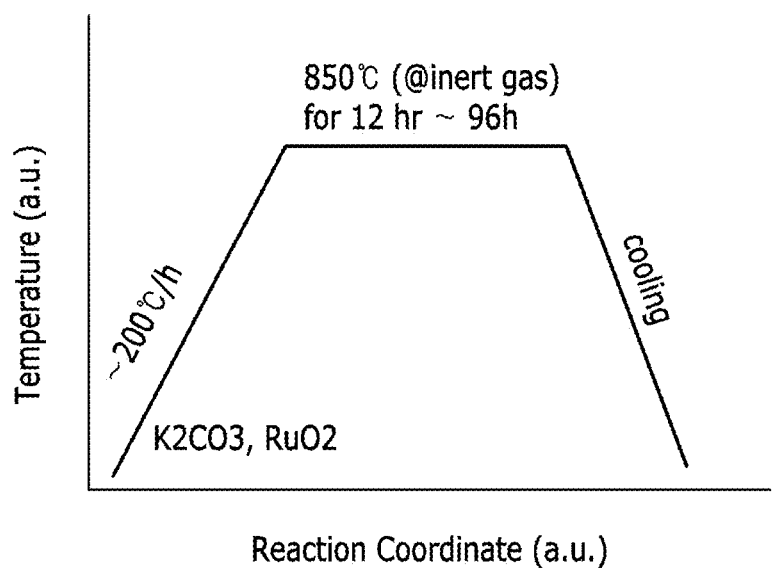
FIG. 6 shows a heat treatment profile for synthesizing an alkali metal-ruthenium oxide in the Examples.

[1] $K_2CO_3$ and $RuO_2$ are mixed at 5:8 (mole ratio), and the mixture is formed into pellets. 4 g of the obtained pellet is placed into an alumina crucible and heat-treated in a tube furnace at 850° C. for 24 hours under the nitrogen atmosphere. The detail heat treatment profile is shown in FIG. 6. The total weight of pellet may be adjusted within a range from 1 to 20 g according to requirements. Subsequently, the furnace is cooled to a room temperature, and the treated pellet is taken out and pulverized to obtain a fine powder.

The obtained fine powder is agitated and rinsed with about 100 milliliters (mL) to 4 liters (L) of water for 24 hours and vacuum-filtered to obtain an intermediate-phase powder. During the rinse, an excessive amount of water-soluble impurities such as a potassium compound is removed. The obtained intermediate-phase powder has a composition of $K_{0.2}RuO_{2.1}\cdot nH_2O$.

The obtained intermediate-phase powder is performed with an inductively coupled plasma mass spectrometry (ICP-MS). The results show that K:Ru has a mole ratio of 0.184:0.814.

Figure 7:
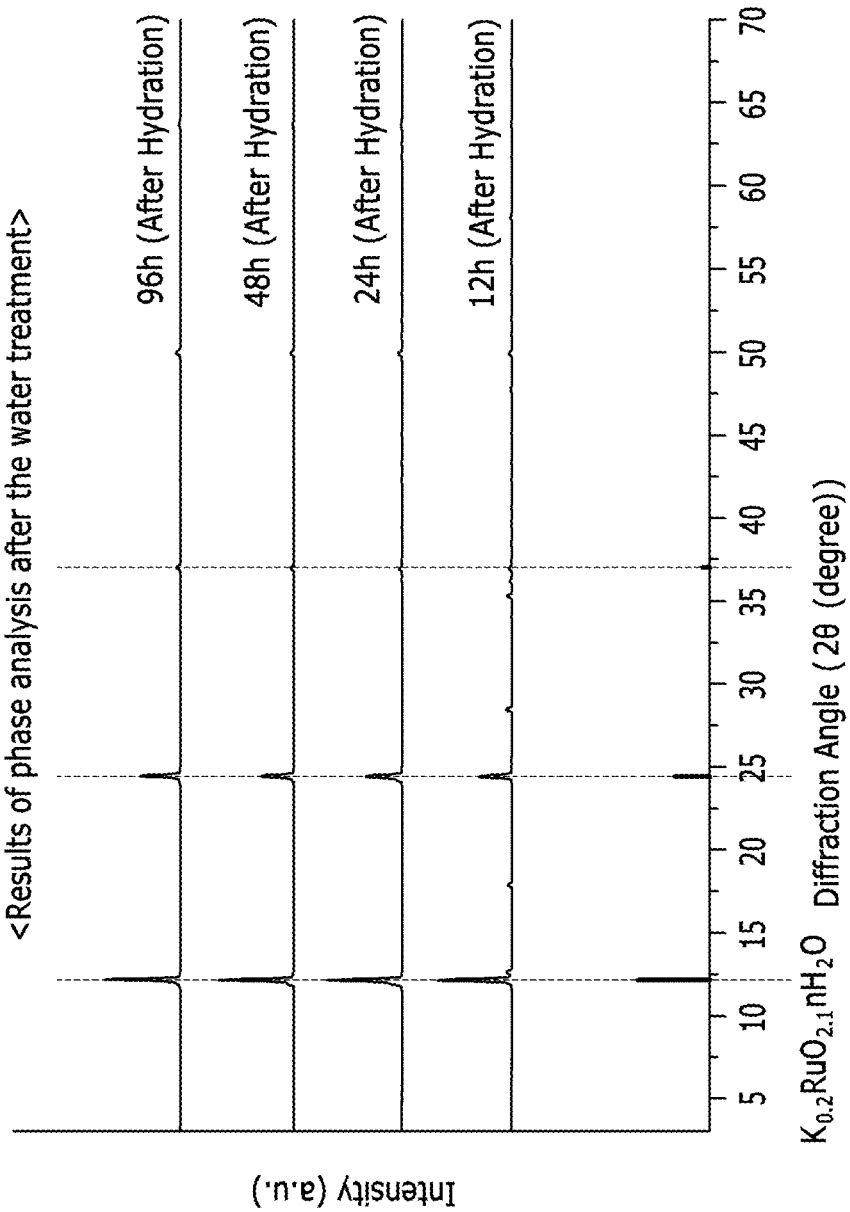
FIG. 7 shows an X-ray diffraction analysis spectrum of the alkali metal-ruthenium oxide hydrates obtained from Examples 1 to 3 and Comparative Example 1.
Figure 8:
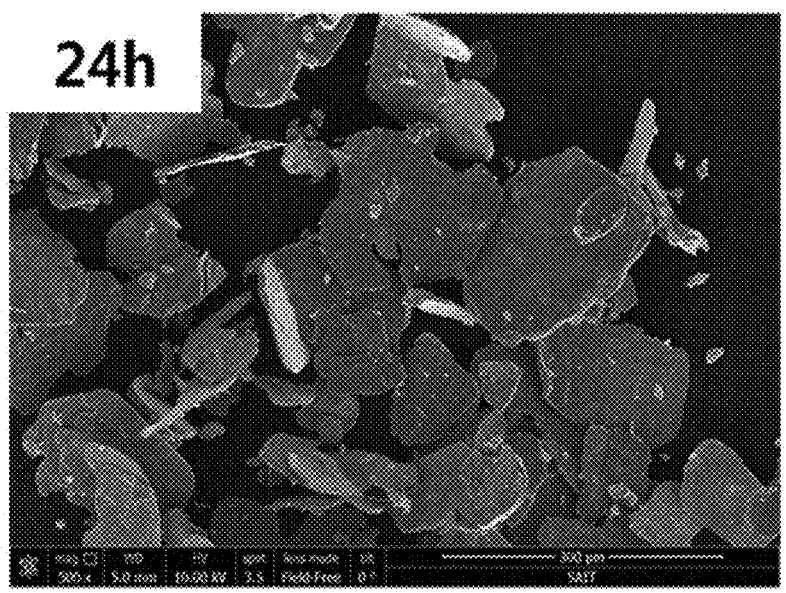
FIG. 8 is a scanning electron microscope image of alkali metal-ruthenium oxide hydrate obtained from Example 1.

The obtained intermediate-phase powder is performed with an X-ray diffraction analysis and a scanning electron microscopic analysis, and the results are shown in FIG. 7 and FIG. 8. From the results of FIG. 7 and FIG. 8, it is confirmed that $K_{0.2}RuO_{2.1}nH_2O$ having a layered structure is synthesized. From the results of X-ray diffraction analysis and scanning electron microscopic analysis, it is confirmed that the intermediate-phase powder has an average size of about 123 μm and substantially no secondary phase.

[2] The obtained $K_{0.2}RuO_{2.1}nH_2O$ powder is added into 1 molar (M) of HCl solution and agitated for 3 days and filtered to obtain only powder. Selectively, the obtained powder may be added into 0.5 M of $H_2SO_4$ aqueous solution, again, and agitated for 2 days. The obtained powder has a composition of $H_{0.2}RuO_{2.1}nH_2O$.

1 g of $H_{0.2}RuO_{2.1}nH_2O$ powder is added into 250 mL of tetrabutylammonium hydroxide (TBAOH) aqueous solution and agitated at a room temperature for 10 days (concentration of TBAOH: TBA+/H+=5). Subsequently, the resulting material is treated with ultrasonic wave in a water bath. The obtained final solution is centrifuged under the condition at 2000 rpm for 30 minutes to obtain exfoliated $RuO_{2+x}$ nanosheets.

Figure 9:
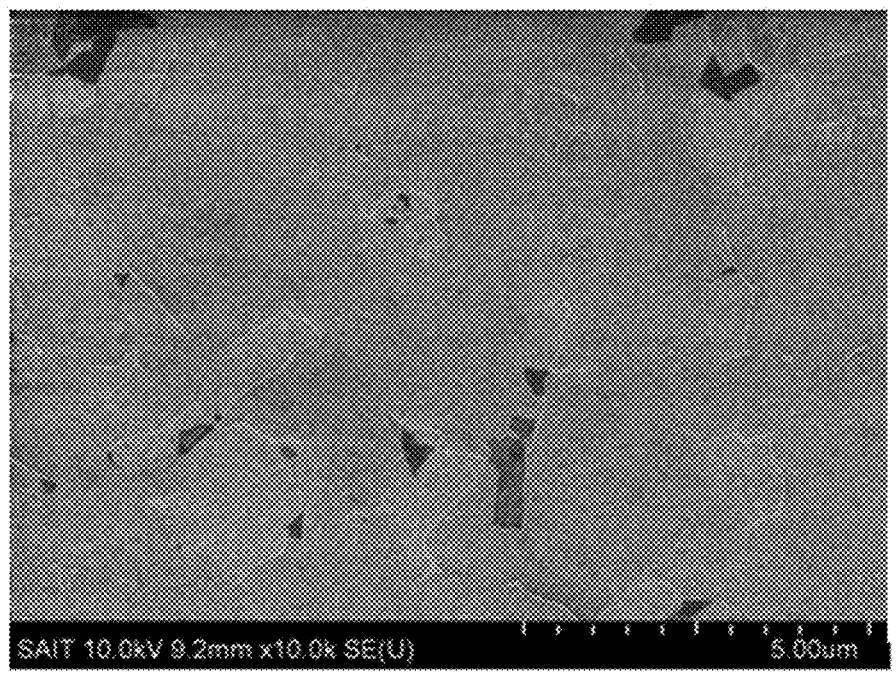
FIG. 9 is a scanning electron microscope image of ruthenium oxide nanosheets obtained from Example 1.

The exfoliated $RuO_{2+x}$ nanosheets are performed with SEM (Scanning Electron Microscopy) analysis, and a part of the results is shown in FIG. 9. From the SEM (Scanning Electron Microscopy) analysis results, it is confirmed that nanosheets have an average lateral length of 1.8 μm.

Figure 10:
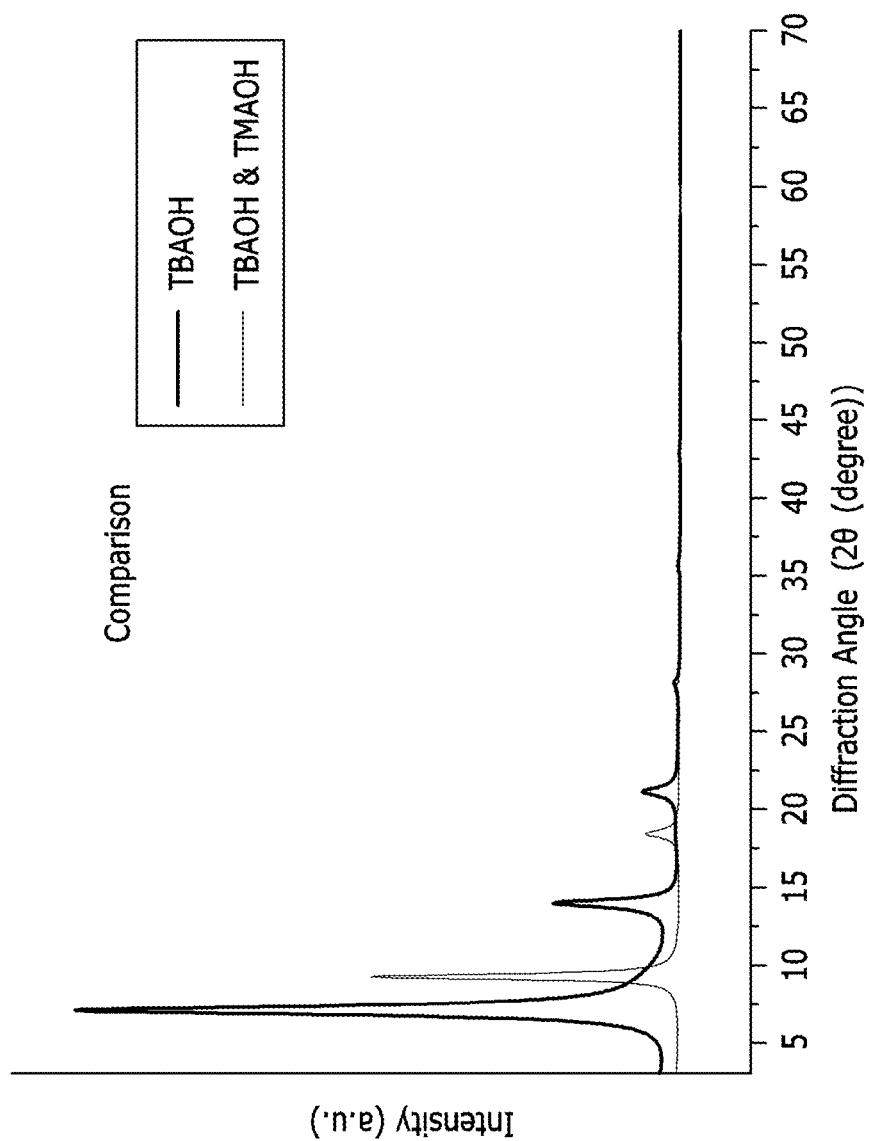
FIG. 10 is an X-ray diffraction spectrum of ruthenium oxide nanosheets obtained from Example 1 and Example 4.

The obtained nanosheets are performed with a XRD analysis, and the results are shown in FIG. 10. From the results, it is confirmed that the interlayer distance is 1.244 nm.

The thickness of obtained nanosheets is measured by an atomic force microscope (AFM). From the results, it is confirmed that the obtained nanosheets have an average thickness of 1.89 nm.

From the results, it is confirmed that the average lateral length of nanosheets is significantly increased with no substantial increase of thickness of nanosheets.

Example 2

Exfoliated $RuO_{2+x}$ nanosheets are obtained in accordance with the same procedure as in Example 1, except that a mixture of $K_2CO_3$ and $RuO_2$ is heat-treated at 850° C. for 48 hours under the nitrogen atmosphere.

During the manufacturing process, the obtained intermediate-phase powder has a composition of $K_{0.2}RuO_{2.1}nH_2O$. The obtained intermediate-phase powder is performed with an inductively coupled plasma mass spectrometry (ICP-MS). From the results, it is confirmed that K:Ru has a mole ratio of 0.184:0.816.

Figure 11:
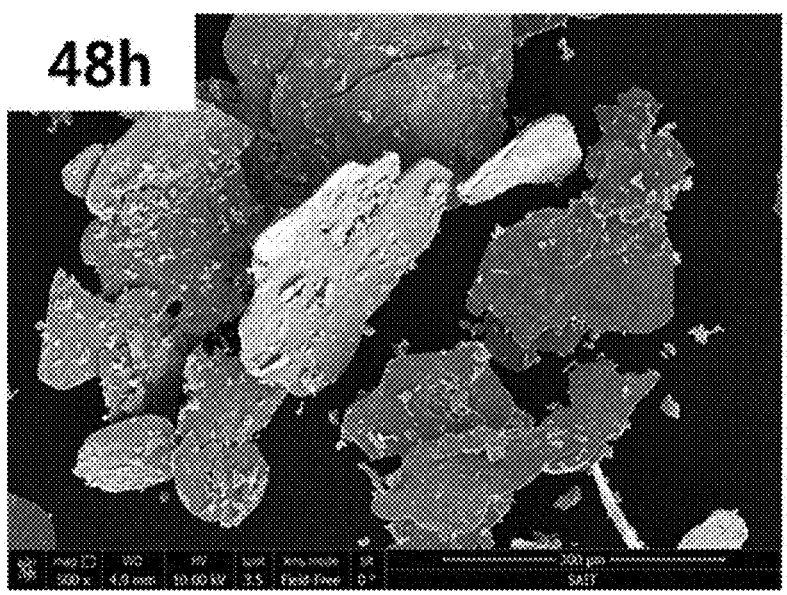
FIG. 11 is a scanning electron microscope image of alkali metal-ruthenium oxide hydrate obtained from Example 2.

The obtained intermediate-phase powder is performed with an X-ray diffraction analysis and a scanning electron microscope analysis, and the results are shown in FIG. 7 and FIG. 11. From the results of FIG. 7 and FIG. 11, it is confirmed that $K_{0.2}RuO_{2.1}nH_2O$ having a layered structure is synthesized. From the results of the X-ray diffraction analysis and the scanning electron microscope analysis, it is confirmed that the hydrate particles have an average size of about 200 μm with no secondary phase.

Figure 12:
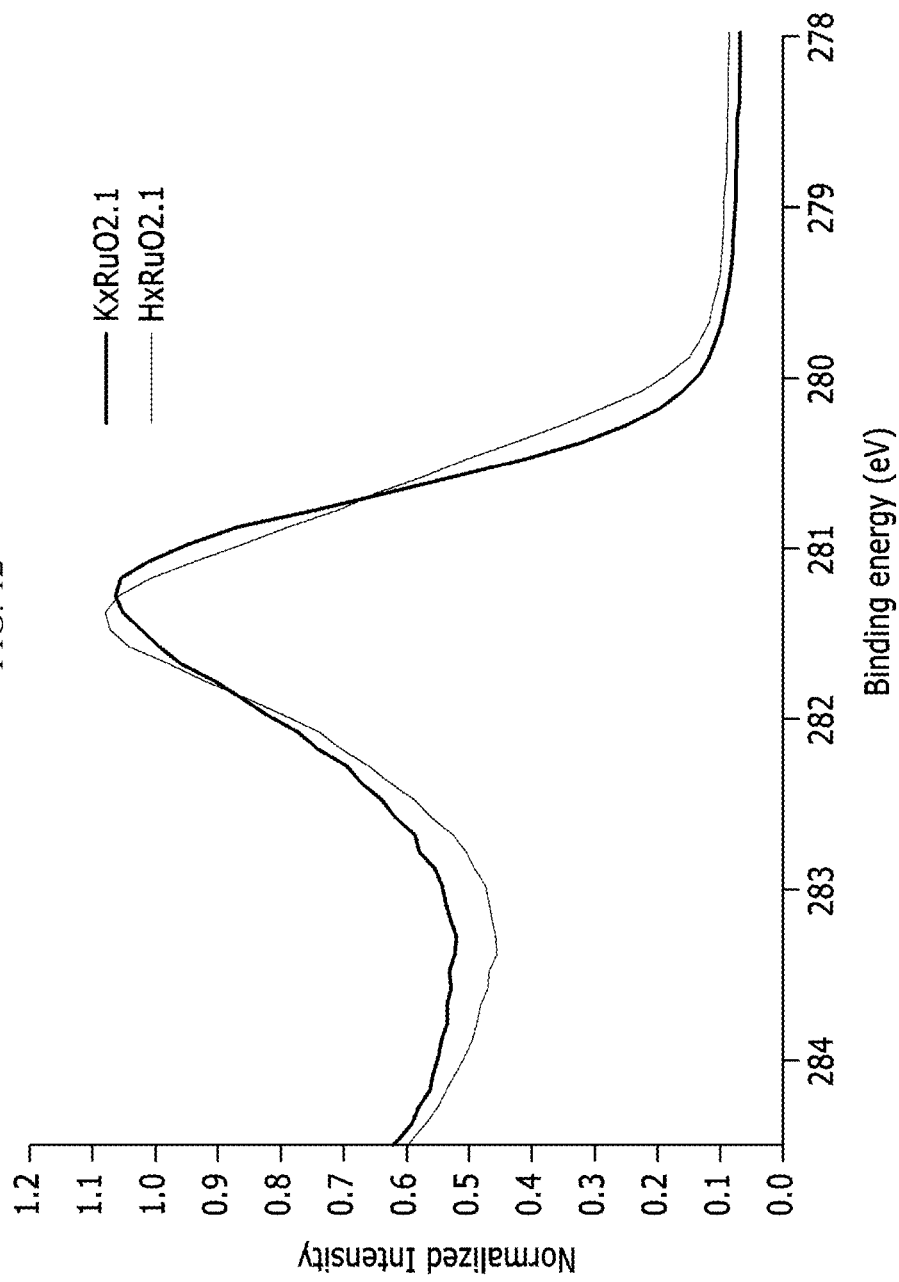
FIG. 12 shows XPS analysis results of alkali metal-ruthenium oxide hydrate obtained Example 2 and the proton-exchanged powder.

The obtained intermediate-phase powder (K shape) and proton-exchanged powder are performed with XPS analysis, and the results are shown in FIG. 12 and Table 4.

In $RuO_2$, it is known that Re peak is shown in 280.7 to 281.3. From the results of FIG. 12, it is confirmed that the intermediate-phase powder (K shape) has a Ru3d peak at 281.3 eV; and the proton-exchanged powder has a Ru3d peak at 281.4 eV. From the results, it is confirmed that Ru has a tetravalent oxidation number, and Ru3d peak is moved in the proton-exchanged powder due to the high binding energy.

TABLE 4

|  | C1s | O1s | K2p | Ru3p3 |
|---|---|---|---|---|
| KxRuO2.1 | 4.71 | 55.61 | 5.95 | 33.56 |
| HxRuO2.1 | 4.71 | 60.99 | 0.19 | 33 |

From Table 4, it is confirmed that the obtained intermediate-phase powder (K shape) may be represented by $K_{0.18}RuO_{2+\alpha}$. It is confirmed that almost of K is remove by the protonation.

Figure 13:
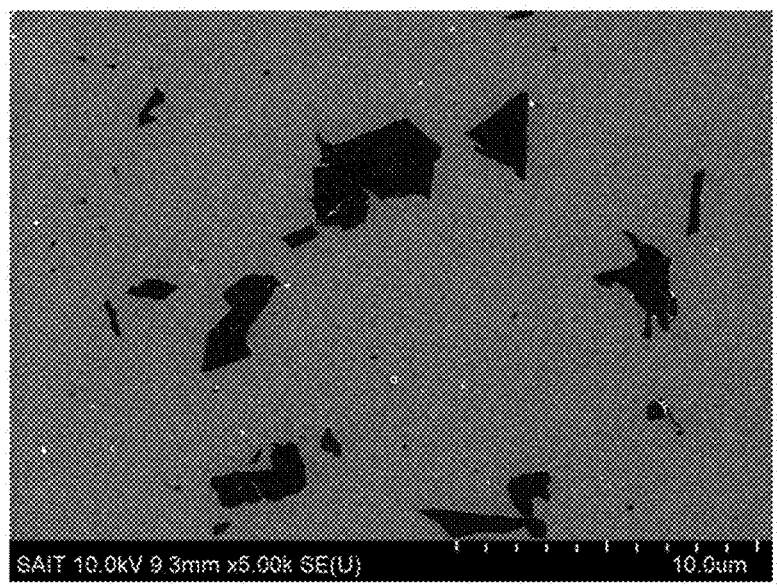
FIG. 13 is a scanning electron microscope image of ruthenium oxide nanosheets obtained from Example 2.

The exfoliated $RuO_{2+x}$ nanosheets are performed with a SEM analysis, the results are shown in FIG. 13. From the SEM analysis results, it is confirmed that nanosheets have an average length of 2.3 μm.

The obtained nanosheets are measured for a thickness by an atomic force microscopy (AFM). From the results, the obtained nanosheets have an average thickness of 2.46 nm.

Example 3

An exfoliated $RuO_{2+x}$ nanosheets are obtained in accordance with the same procedure as in Example 1, except that a mixture of $K_2CO_3$ and $RuO_2$ is heat-treated at 850° C. for 96 hours under the nitrogen atmosphere.

During the manufacturing process, the obtained intermediate-phase powder has a composition of $K_{0.2}RuO_{2.1}nH_2O$.

Figure 14:
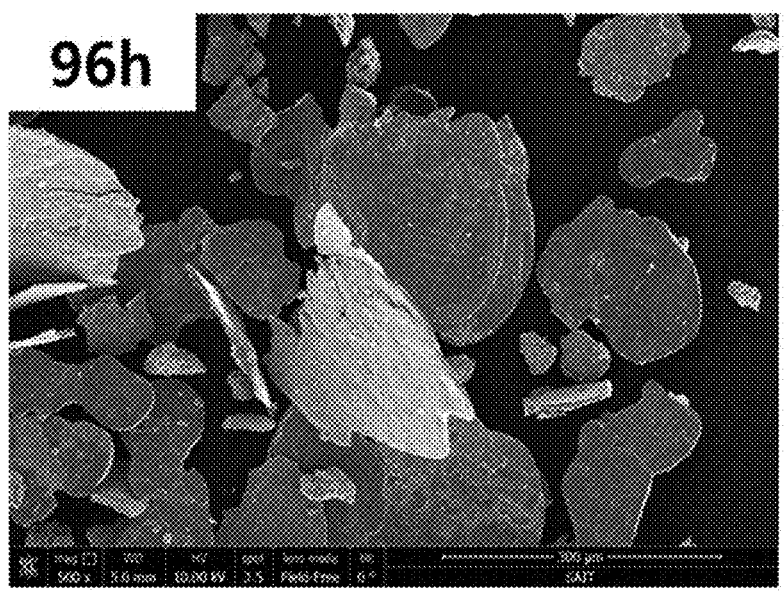
FIG. 14 is a scanning electron microscope image of alkali metal-ruthenium oxide hydrate obtained from Example 3.

The obtained intermediate-phase powder is performed with an X-ray diffraction analysis and a scanning electron microscopic analysis, and the results are shown in FIG. 7 and FIG. 14. From the results of FIG. 7 and FIG. 14, it is confirmed that $K_{0.2}RuO_{2.1}nH_2O$ having a layered structure is synthesized. From the results of the X-ray diffraction analysis and the scanning electron microscopic analysis, the hydrate particles have an average size of about 230 microns with no secondary phase.

Figure 15:
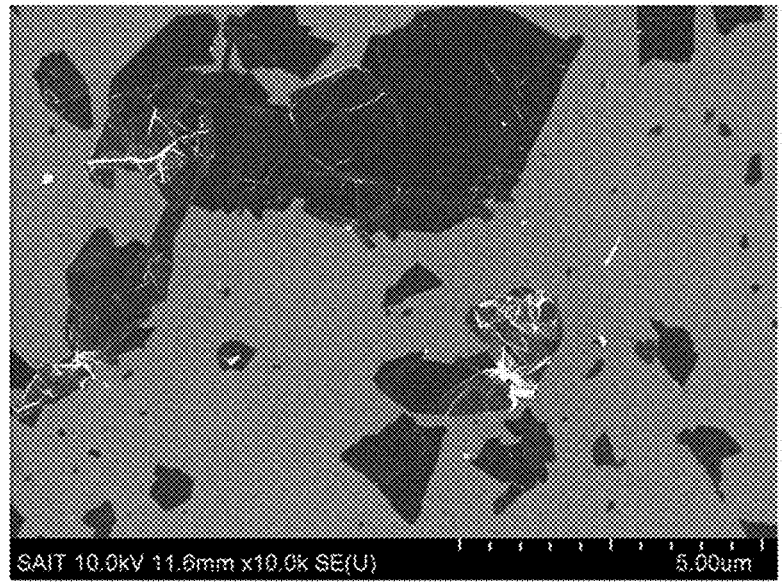
FIG. 15 is a scanning electron microscope image of ruthenium oxide nanosheets obtained from Example 3.

The exfoliated $RuO_{2+x}$ nanosheets are performed with a SEM analysis, the results are shown in FIG. 15. From the SEM analysis results, it is confirmed that nanosheets have an average length of 3.5 μm.

The obtained nanosheets are measured for a thickness by an atomic force microscopy (AFM). From the results, the obtained nanosheets have an average thickness of 1.50 nm.

Example 4

An exfoliated $RuO_{2+x}$ nanosheets are obtained in accordance with the same procedure as in Example 1, except that 1 g of the obtained $H_{0.2}RuO_{2.1}nH_2O$ powder is added into 250 mL of an aqueous solution including TMAOH and TBAOH (concentrations of TMAOH and TBAOH are TMA+/H+=5, TBA+/H+=5, respectively) and agitated for greater than or equal to about 10 days.

Figure 16:
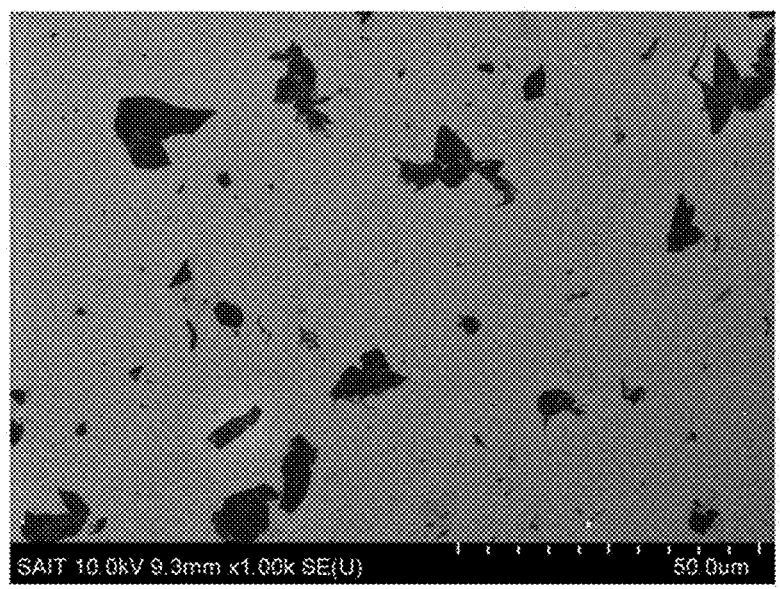
FIG. 16 is a scanning electron microscope image of ruthenium oxide nanosheets obtained from Example 4.

The exfoliated $RuO_{2+x}$ nanosheets are performed with a SEM (Scanning Electron Microscopy) analysis, the results are shown in FIG. 16. From the SEM analysis results, it is confirmed that nanosheets have an average length of 7.0 μm.

The obtained nanosheets are measured for a thickness by an atomic force microscopy (AFM). From the results, the obtained nanosheets have an average thickness of 1.23 nm.

The obtained nanosheets are performed with a XRD analysis, and the results are shown in FIG. 10. From the results, it is confirmed that the interlayer distance is 0.951 nm.

Example 5

$RuO_{2+x}$ nanosheets are obtained in accordance with the same procedure as in Example 2, except that a mixture of $K_2CO_3$ and $RuO_2$ is heat-treated at 850° C. for 48 hours under the nitrogen atmosphere, and 1 g of the obtained $H_{0.2}RuO_{2.1}nH_2O$ powder is added into 250 mL of an aqueous solution including TMAOH and TBAOH (concentrations of TMAOH and TBAOH are TMA+/H+=5, TBA+/H+=5, respectively) and agitated for greater than or equal to about 10 days.

Figure 17:
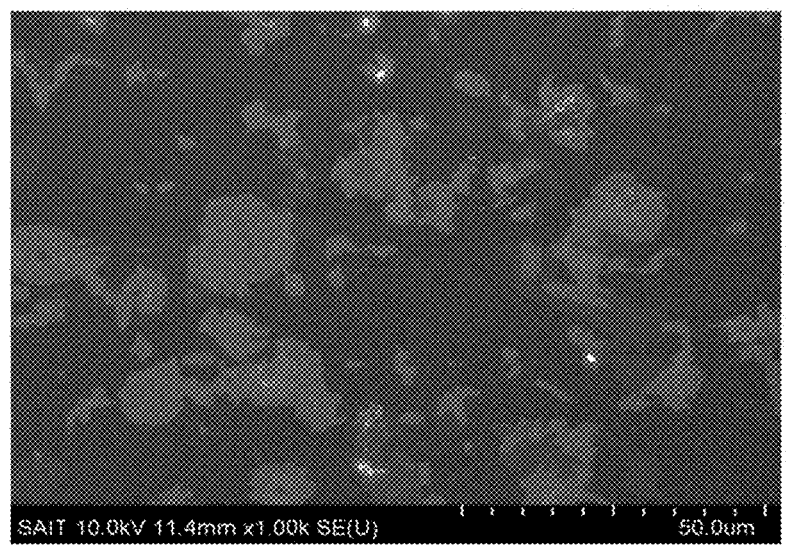
FIG. 17 is a scanning electron microscope image of ruthenium oxide nanosheets obtained from Example 5.

The exfoliated $RuO_{2+x}$ nanosheets are performed with a SEM (Scanning Electron Microscopy) analysis, and a part of the results is shown in FIG. 17. From the SEM analysis results, it is confirmed that nanosheets have an average length of 10.2 μm.

The obtained nanosheets are measured for a thickness by an atomic force microscopy (AFM). From the results, the obtained nanosheets have an average thickness of 1.50 nm.

Comparative Example 1: Preparation of $RuO_{2+x}$ Nanosheet

An exfoliated $RuO_{2+x}$ nanosheets are obtained in accordance with the same procedure as in Example 1, except that a mixture of $K_2CO_3$ and $RuO_2$ is heat-treated at 850° C. for 12 hours under the nitrogen atmosphere.

During the manufacturing process, the obtained intermediate-phase powder has a composition of $K_{0.2}RuO_{2.1}nH_2O$.

Figure 18:
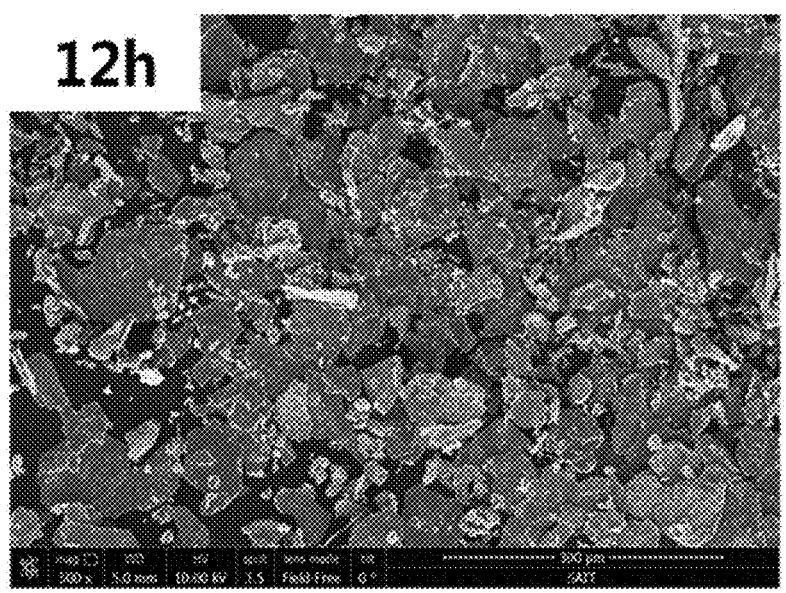
FIG. 18 is a scanning electron microscope image of alkali metal-ruthenium oxide hydrate obtained from Comparative Example 1.

The obtained intermediate-phase powder is performed with an X-ray diffraction analysis and a scanning electron microscopic analysis, and the results are shown in FIG. 7 and FIG. 18. From the results of FIG. 7 and FIG. 18, it is confirmed that $K_{0.2}RuO_{2.1}nH_2O$ having a layered structure is synthesized. From the results of the X-ray diffraction analysis and the scanning electron microscopic analysis, it is confirmed that the hydrate particles have an average size of about 60 microns and also include $K_2Ru_8O_{16}$ having a needle structure as the secondary phase.

Figure 19:
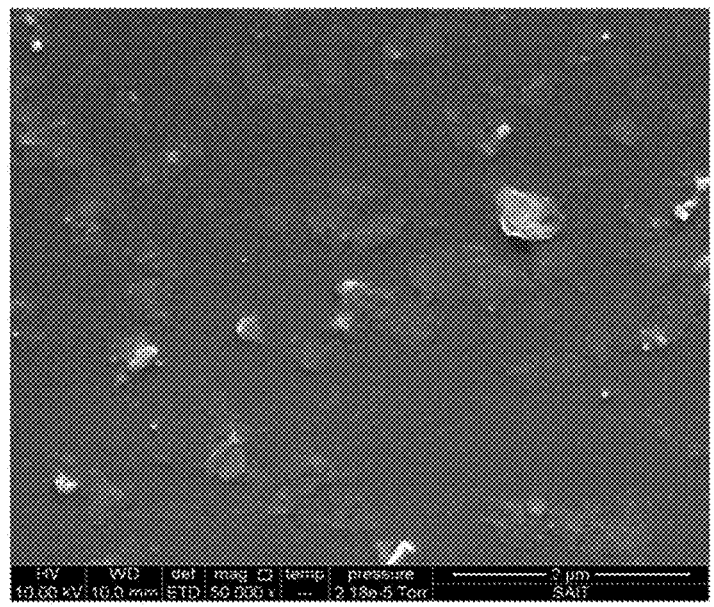
FIG. 19 is a scanning electron microscope image of ruthenium oxide nanosheets obtained from Comparative Example 1.

The exfoliated $RuO_{2+x}$ nanosheets are performed with a SEM (Scanning Electron Microscopy) analysis, the results are shown in FIG. 19. From the SEM analysis results, it is confirmed that nanosheets have an average length of 0.7 µm.

The obtained nanosheets are measured for a thickness by an atomic force microscopy (AFM). From the results, the obtained nanosheets have an average thickness of 3.85 nm.

Preparation of Electrical Conductor

Example 6

Prepared is a coating liquid including $RuO_{2+x}$ nanosheets (average lateral size: 1.8 µm) obtained from Example 1 and having the following composition:
3 g of aqueous dispersion of the obtained $RuO_{2+x}$ nanosheets
0.5 g of HPMC aqueous solution (0.3%)
3 g of isopropanol
1 g of water The obtained $RuO_{2+x}$ nanosheet coating liquid is bar-coated on a polycarbonate substrate and dried at 85° C. under the air atmosphere. The process is repeated for 3 times to provide a first conductive layer. It is confirmed that the first conductive layer obtained by the bar-coating has a thickness of 1-5 nm. A sheet resistance and a light transmittance of the obtained first conductive layer are measured. From the results, it is confirmed that the sheet resistance is 32000 Ω/sq, and the transmittance is 94.4%.

Example 7

A first conductive layer is formed in accordance with the same procedure as in Example 6, except that the $RuO_{2+x}$ nanosheets (average lateral size: 2.3 µm) obtained Example 2 is used. A sheet resistance and a light transmittance of the obtained first conductive layer are measured. From the results, it is confirmed that the sheet resistance is 20250 ohms per square (Ω/sq), and the transmittance is 94.3%.

Example 8

A first conductive layer is formed in accordance with the same procedure as in Example 6, except that the $RuO_{2+x}$ nanosheets (average lateral size: 3.5 µm) obtained Example 3 is used. A sheet resistance and a light transmittance of the obtained first conductive layer are measured. From the results, it is confirmed that the sheet resistance is 11220 Ω/sq, and the transmittance is 93.9%.

Example 9

A first conductive layer is formed in accordance with the same procedure as in Example 6, except that the $RuO_{2+x}$ nanosheets (average lateral size: 7.0 µm) obtained Example 4 is used. A sheet resistance and a light transmittance of the obtained first conductive layer are measured. From the results, it is confirmed that the sheet resistance is 12625 Ω/sq, and the transmittance is 94.0%.

Example 10

A first conductive layer is prepared in accordance with the same procedure as in Example 6, except that $RuO_{2+x}$ nanosheets (average lateral size: 10.2 µm) obtained from Example 5 is used. A sheet resistance and a light transmittance of the obtained first conductive layer are measured. From the results, it is confirmed that the sheet resistance is 10250 Ω/sq, and the transmittance is 93.1%.

Comparative Example 2

A first conductive layer is prepared in accordance with the same Example 6, except that $RuO_{2+x}$ nanosheets obtained from Comparative Example 1 (average lateral size: 0.7 µm) is used. The obtained first conductive layer is measured for a sheet resistance and a light transmittance. From the results, it is confirmed that the sheet resistance is 87000 Ω/sq, and the transmittance is 94.3%.

Figure 20:
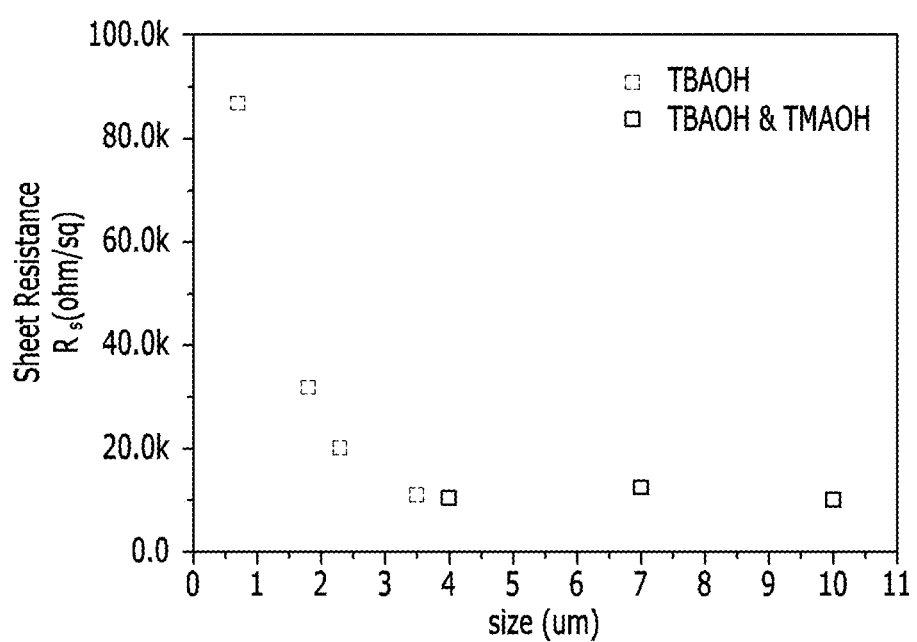
FIG. 20 is a graph showing a sheet resistance with respect to an average lateral dimension of conductive layers obtained from Examples 6 to 10 and Comparative Example 2.

The sheet resistances of the conductive layers obtained from Examples 6 to 10 and Comparative Example 2 and the average lateral sizes of nanosheets forming each conductive layer are shown in graph of FIG. 20. From FIG. 20, it is confirmed that the conductive layer including nanosheets having an lateral size of greater than or equal to about 1.1 µm may show the significantly enhanced electrical conductivity (i.e., decreased sheet resistance) at the similar level of light transmittance.

Example 11

[1] A silver nanowire-containing composition having the following components is obtained:
3 g of silver nanowire aqueous solution (concentration: 0.5 wt %, average diameter of silver nanowire: 30 nm)
Solvent: 7 g of water and 3 g of ethanol
Binder: 0.5 g of hydroxypropyl methyl cellulose aqueous solution (concentration: 0.3%)

The silver nanowire-containing composition is bar-coated on the first conductive layer obtained from Example 6 and dried at 85° C. for 1 minute under the air atmosphere to obtain an electrical conductor having a structure of substrate-conductive layer of ruthenium oxide nanosheets/conductive layer of silver nanowire.

Example 12: Evaluation of Flexibility of Electrical Conductor Having Hybrid Structure (Simulation)

[1] The flexibility of the electrical conductor having the hybrid structure is evaluated by the calculation of the silver nanowire random network sheet resistance based on the following steps:

The silver nanowire random network is made by randomly designating the central coordinates (x, y) and angle θ of wire in the square simulation domain using MATLAB.

For the wires made in the aforementioned manner, it is determined whether they meet another wire in the network using a formula for calculating a distance between two straight lines, and thereby the wire contact information is stored.

A cluster of wires through which the current may flow from the wire contacting the left end of square simulation domain to the wire contacting the right end without stopping is determined using the stored inter-contact information between the wires.

While considering the resistance of Ag NW itself and the contact resistance between the wires for all the wire contact points (junction) in each cluster, a linear equation is established by applying the Kirchhoff current law.

In this case, the linear equation is transformed in order to apply a 2D hybrid wherein the NW junction deformed by bending is a model flowing through 2D sheet, and the 2D sheet is assumed to have 100% coverage.

In a delamination model wherein the wire is not cut, it is assumed that some of inter-wire junctions are spaced, and current is flowed through the 2D sheet instead of the spaced contact and thus the contact resistance of the linear equation corresponding to the spaced junction is changed to the 2D sheet resistance.

Figure 21:
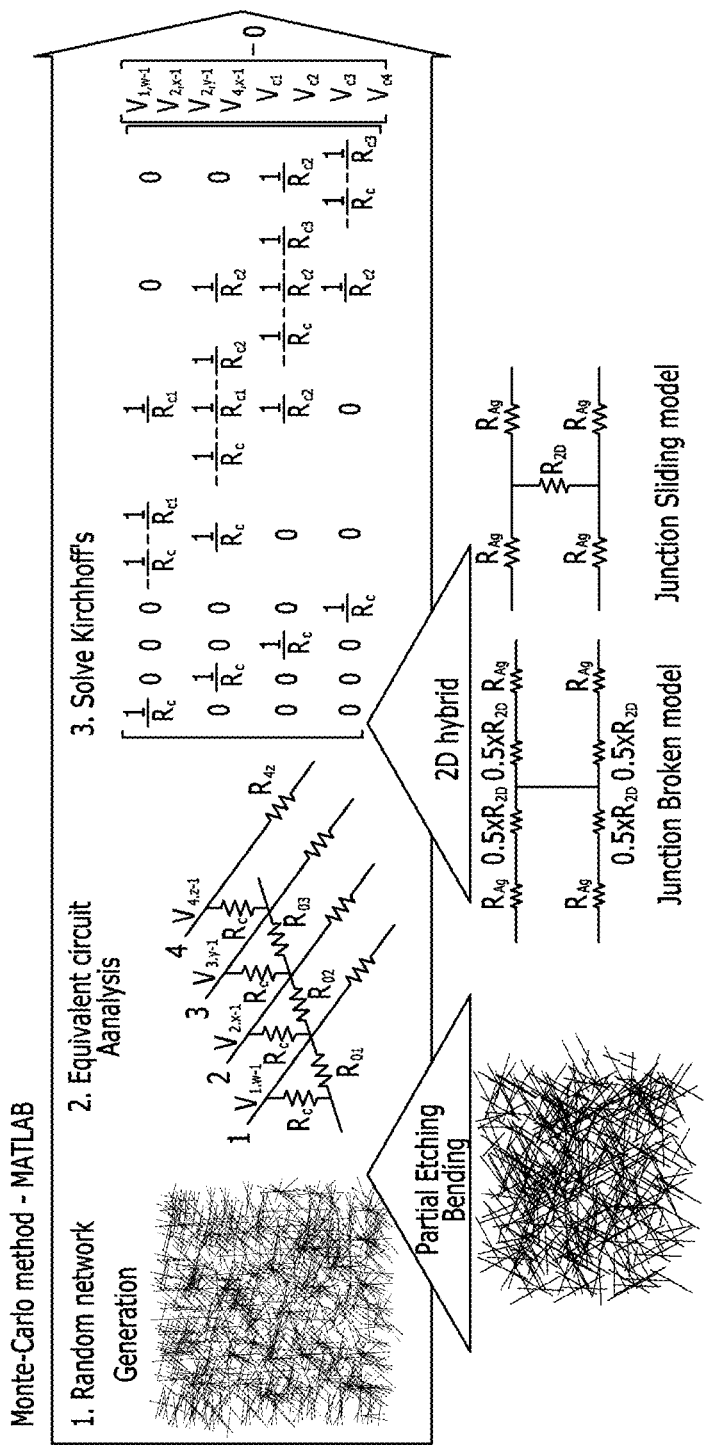
FIG. 21 is a view schematically illustrating a method of performing a flexibility evaluating test (computer simulation) of Example 12.

In a broken junction model wherein the wire is cut, the linear equation is transformed by removing the contract resistance of the linear equation corresponding to the broken junction and adding the resistance corresponding to half of the 2D sheet to the broken wire resistance in series (referring to FIG. 21). (referred to FIG. 21)

The linear equation is solved as many times as the number of junctions to calculate the value of the current flowing when a 1 V voltage is applied from left to right of the square simulation domain, and based on this current value, the sheet resistance of the Ag NW network is calculated.

Figure 22:
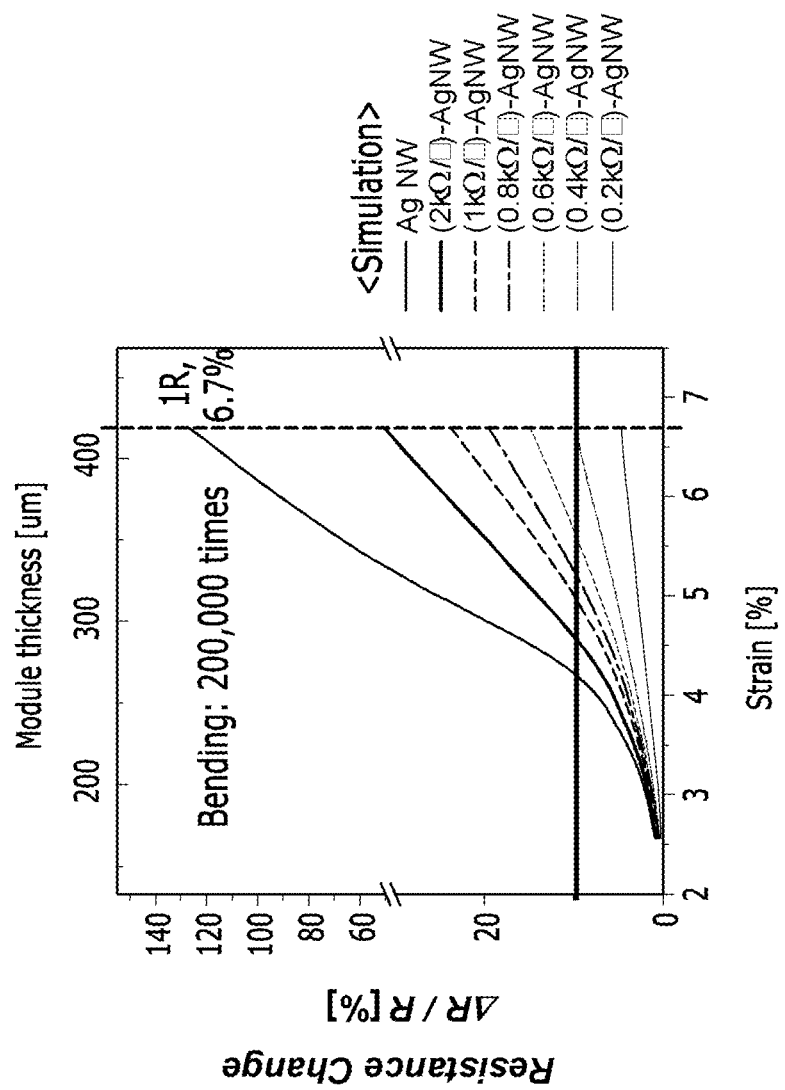
FIG. 22 shows the flexibility evaluating test (simulation) results of Example 12.

[2] From the results of FIG. 22, it is confirmed that the conductor having a nanowire/nanosheet hybrid structure may show an improved resistance change compared to the conductor having only the nanowire, when the 2D nanosheet layer having predetermined sheet resistance is present.

Reference Example 2: Synthesis of Alkali Metal Vanadium Oxide $Na_2CO_3$ and $V_2O_3$ are mixed at 1:1 (mole ratio), and the mixture is formed into pellets. 4 g of the obtained pellets is placed into a platinum crucible and heat-treated in a tube furnace at 800° C. for 24 hours under the hydrogen/nitrogen (1:9) atmosphere. Subsequently, the furnace is cooled to the room temperature, and the treated pellet is taken out and pulverized to provide a fine powder.

Figure 23:
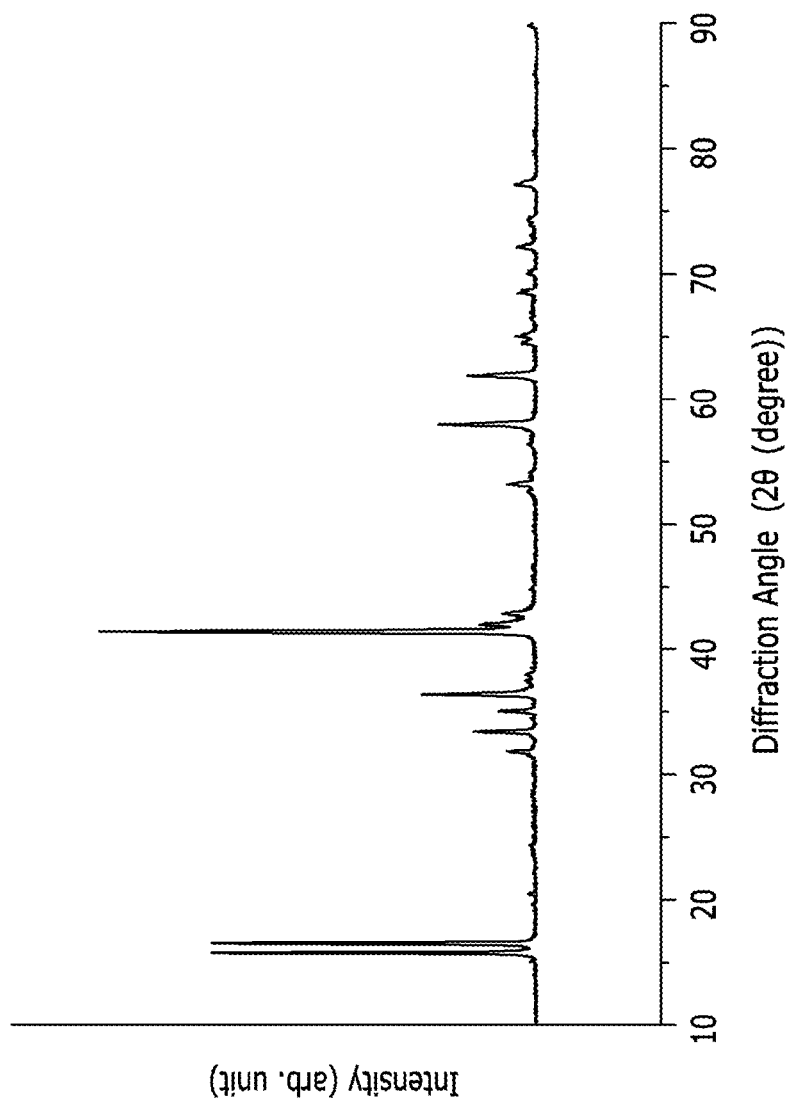
FIG. 23 shows the X-ray diffraction analysis results of $NaVO_2$ obtained from Reference Example 2.

The X-ray diffraction spectrum of the obtained $NaVO_2$ is shown in FIG. 23. From the results of FIG. 23, it is confirmed that $NaVO_2$ has a layered structure.

The obtained fine powder may be formed into nanosheets according to the similar method to Example 1.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrical conductor comprising
   a substrate having a first surface and a second surface opposite to the first surface; and
   a first conductive layer having a third surface and a fourth surface opposite to the third surface and essentially consisting of a plurality of layered metal oxide nanosheets, the first conductive layer being disposed on the substrate so that the third surface of the first conductive layer faces the first surface of the substrate,
   wherein adjacent metal oxide nanosheets of the plurality of metal oxide nanosheets contact to provide an electrically conductive path between the contacting metal oxide nanosheets,
   wherein the plurality of metal oxide nanosheets comprise an oxide of Re, V, Os, Ru, Ta, Ir, Nb, W, Ga, Mo, In, Cr, Rh, Mn, Co, Fe, or a combination thereof, and
   wherein the plurality of metal oxide nanosheets have an average lateral dimension of greater than or equal to about 1.1 micrometers.

2. The electrical conductor of claim 1, wherein the metal oxide nanosheets of the plurality of metal oxide nanosheets have an average lateral dimension of greater than or equal to about 1.5 micrometers and an average thickness of less than or equal to about 5 nanometers.

3. The electrical conductor of claim 1, wherein the first conductive layer is a discontinuous layer including an open space between metal oxide nanosheets of the plurality of metal oxide nanosheets, and
   wherein an area of the open space is less than about 50% of an area of the first conductive layer.

4. The electrical conductor of claim 1, wherein the first conductive layer has sheet resistance of less than or equal to about 33000 ohms per square and has a light transmittance of about 93% or greater.

5. The electrical conductor of claim 4, wherein the first conductive layer has a sheet resistance of less than or equal to about 15000 ohms per square and has a light transmittance of about 93% or greater.

6. The electrical conductor of claim 1, wherein the metal oxide nanosheets of the plurality of metal oxide nanosheets comprise ruthenium oxide, vanadium oxide, manganese oxide, cobalt oxide, iron oxide, rhenium oxide, iridium oxide, indium oxide, or a combination thereof.

7. The electrical conductor of claim 1, wherein the plurality of metal oxide nanosheets comprises $RuO_{2+x}$ wherein $0 \leq x \leq 0.5$, $MnO_2$, $Mn_3O_7$, $Mn_{1-x}Co_xO_2$ wherein $0 < x \leq 0.4$, $VO_2$, $CoO_2$, $FeO_2$, $ReO_2$, $IrO_2$, $InO_2$, or a combination thereof.

8. The electrical conductor of claim 1, which further comprises a second conductive layer disposed on the substrate and comprising an electrically conductive metal nanowire.

9. The electrical conductor of claim 8, wherein the second conductive layer is disposed between the substrate and the first conductive layer.

10. The electrical conductor of claim 8, wherein the second conductive layer is disposed on the fourth surface of the first conductive layer.

11. The electrical conductor of claim 8, wherein the electrically conductive metal nanowire comprises silver, copper, gold, aluminum, cobalt, palladium, or a combination thereof.

12. The electrical conductor of claim 8, wherein the conductive metal nanowire has an average diameter of less than or equal to about 50 nanometers and an average length of greater than or equal to about 1 micrometer.

13. The electrical conductor of claim 1, wherein the electrical conductor has transmittance of greater than or equal to about 85% at a wavelength of 550 nanometers and sheet resistance of less than or equal to about 100 ohms per square.

14. The electrical conductor of claim 1, further comprising an overcoating layer comprising a thermosetting resin, an ultraviolet curable resin, or a combination thereof directly on the first conductive layer.

15. The electrical conductor of claim 8, further comprising an overcoating layer including a thermosetting resin, an ultraviolet curable resin, or a combination thereof directly on the second conductive layer.

16. An electronic device including the electrical conductor of claim 1.

17. The electronic device of claim 15, wherein the electronic device is a flat panel display, a touch screen panel, a solar cell, an e-window, an electrochromic mirror, a heat mirror, a transparent transistor, or a flexible display.

18. The electrical conductor of claim 1, wherein the substrate is transparent and flexible.

\* \* \* \* \*